(12) United States Patent
Ohta et al.

(10) Patent No.: US 9,709,377 B2
(45) Date of Patent: Jul. 18, 2017

(54) STRAIN SENSOR CHIP MOUNTING STRUCTURE, STRAIN SENSOR CHIP AND METHOD OF MANUFACTURING A STRAIN SENSOR CHIP MOUNTING STRUCTURE

(75) Inventors: Hiroyuki Ohta, Tokyo (JP); Kisho Ashida, Tokyo (JP)

(73) Assignee: HITACHI, LTD., Tokyo (JP)

( * ) Notice: Subject to any disclaimer, the term of this patent is extended or adjusted under 35 U.S.C. 154(b) by 300 days.

(21) Appl. No.: 14/396,399

(22) PCT Filed: Apr. 23, 2012

(86) PCT No.: PCT/JP2012/060859
§ 371 (c)(1),
(2), (4) Date: Oct. 23, 2014

(87) PCT Pub. No.: WO2013/160989
PCT Pub. Date: Oct. 31, 2013

(65) Prior Publication Data
US 2015/0075290 A1 Mar. 19, 2015

(51) Int. Cl.
*G01B 7/16* (2006.01)
*G01L 1/00* (2006.01)
(Continued)

(52) U.S. Cl.
CPC ............... *G01B 7/18* (2013.01); *G01L 1/18* (2013.01); *G01M 5/0083* (2013.01);
(Continued)

(58) Field of Classification Search
None
See application file for complete search history.

(56) References Cited

U.S. PATENT DOCUMENTS 5,880,373 A * 3/1999 Barton ............... G01L 19/0645
73/721
6,393,919 B1 * 5/2002 Ohji ....................... D06F 37/203
68/23.1
(Continued)

FOREIGN PATENT DOCUMENTS

JP 55-7323 A 1/1980
JP 56-118375 A 9/1981
(Continued)

*Primary Examiner* — Peter MacChiarolo
*Assistant Examiner* — Jermaine Jenkins
(74) *Attorney, Agent, or Firm* — Baker Botts L.L.P.

(57) ABSTRACT

Even when a strain sensor chip and an object to be measured are bonded to each other by using a metallic bonding material such as solder, the metallic bonding material shows the creep behavior when used under high temperature environment of, for example, 100° C. or higher, and therefore, the strain detected by the strain sensor chip is gradually reduced, and the strain is apparently reduced. In the strain sensor chip mounting structure which is one embodiment of the present application, a strain sensor chip is fixed onto a surface to be measured of the object to be measured via a metallic bonding material. And, the metallic bonding material is bonded to a metallic film that is formed on a side surface of the strain sensor chip. In this manner, temporal change in a measurement error can be suppressed.

19 Claims, 16 Drawing Sheets

(51) Int. Cl.
  *G01L 1/18* (2006.01)
  *G01M 5/00* (2006.01)
  *H01L 21/78* (2006.01)

(52) U.S. Cl.
  CPC .......... *H01L 21/78* (2013.01); *H01L 2224/32* (2013.01); *H01L 2924/10158* (2013.01)

(56) References Cited

U.S. PATENT DOCUMENTS

| | | | | |
|---|---|---|---|---|
| 7,459,794 | B2* | 12/2008 | Yokoyama | H01L 23/49866 257/779 |
| 8,242,378 | B2* | 8/2012 | Amin | H05K 3/244 174/257 |
| 8,581,403 | B2* | 11/2013 | Ouchi | H01L 23/49811 257/738 |
| 8,884,434 | B2* | 11/2014 | Mengel | H01L 24/03 257/762 |
| 2012/0153444 | A1* | 6/2012 | Haga | H01L 24/29 257/666 |
| 2014/0070415 | A1* | 3/2014 | Vincent | H01L 24/19 257/741 |
| 2014/0272201 | A1* | 9/2014 | Takeda | C09J 133/066 428/1.54 |
| 2015/0102807 | A1* | 4/2015 | Eckinger | G01R 33/072 324/251 |
| 2015/0200181 | A1* | 7/2015 | Haga | B23K 20/005 438/127 |

FOREIGN PATENT DOCUMENTS

| | | |
|---|---|---|
| JP | 9-320996 A | 12/1997 |
| JP | 2008-166579 A | 7/2008 |
| JP | 2009-44123 A | 2/2009 |
| JP | 2009-264976 A | 11/2009 |

* cited by examiner

STRAIN SENSOR CHIP MOUNTING STRUCTURE, STRAIN SENSOR CHIP AND METHOD OF MANUFACTURING A STRAIN SENSOR CHIP MOUNTING STRUCTURE

TECHNICAL FIELD

The present invention relates to a strain sensor device, and, more particularly, the present invention relates to a technique effectively applied to a mounting structure of a semiconductor strain sensor chip for measuring strain within an adhered surface of an object to be measured.

BACKGROUND ART

Japanese Patent Application Laid-Open Publication No. 2009-264976 (Patent Document 1) describes that a strain sensor chip for measuring strain within an adhered surface of an object to be measured is bonded to a metallic base plate by using metal solder. Further, Japanese Patent Application Laid-Open Publication No. H09-320996 (Patent Document 2) describes a technique of suppressing generation of chipping or others in a dicing step by performing the dicing step while forming a taper trench on a peripheral edge portion of a rear surface of a semiconductor chip.

PRIOR ART DOCUMENTS

Patent Documents

Patent Document 1: Japanese Patent Application Laid-Open Publication No. 2009-264976
Patent Document 2: Japanese Patent Application Laid-Open Publication No. H09-320996

SUMMARY OF THE INVENTION

Problems to be Solved by the Invention

As a method of measuring strain or stress of a structure, a measurement technique using a semiconductor strain sensor is cited. The semiconductor strain sensor is a device having a strain detecting portion configured by using, for example, a semiconductor piezoresistive element which is formed by doping an impurity to a semiconductor material such as silicone (Si), and sensitivity of the semiconductor strain sensor can be improved more than that of a strain gauge using deformation of a metallic thin film. The present inventors of the present invention have studied a measuring technique using a semiconductor strain sensor, and have found the following problem.

In the measurement using the semiconductor strain sensor, a strain sensor chip (semiconductor chip) is bonded onto a surface to be measured of an object to be measured so as to measure the strain of the surface to be measured. A strain sensor element (detecting portion) is formed in the strain sensor chip, and the strain transmitted from the surface to be measured to the strain sensor chip is measured by the detecting portion. Therefore, in view of improving a measuring accuracy of the strain sensor chip, it is preferred to use a metallic bonding material such as solder as a bonding material for bonding the surface to be measured and the strain sensor chip.

However, according to the study made by the present inventors of the present invention, even when the strain sensor chip is bonded using such a metallic bonding material as solder, the metallic bonding material shows creep behavior when used under a high temperature environment of, for example, 100° C. or higher, and therefore, the strain detected by the strain sensor chip is gradually reduced, which results in apparent reduction in the strain. That is, temporal change of a measurement error occurs.

The present invention has been made in view of the above-described problem, and a preferred aim of the present invention is to provide a technique for suppressing temporal change of a measurement error in measurement using a strain sensor chip.

The above and other preferred aims and novel characteristics of the present invention will be apparent from the description of the present specification and the accompanying drawings.

Means for Solving the Problems

The present application includes a plurality of means for solving the above-described problem, and one example of them is cited as follows.

That is, in a strain sensor chip according to one aspect of the present application, a metallic film is formed on not only a rear surface which is a mounting surface of the strain sensor chip but also a side surface. Also, in a strain sensor chip mounting structure according to one aspect of the present invention, the strain sensor chip is fixed onto a surface to be measured of an object to be measured via a metallic bonding material. And, the metallic bonding material is bonded to the metallic film formed on the side surface of the strain sensor chip. Also, in a method of manufacturing a strain sensor chip mounting structure according to one aspect of the present invention, a metallic film is formed on not only a rear surface which is a mounting surface of a strain sensor chip but also a side surface by separating a semiconductor wafer into pieces, and then, forming the metallic film from the rear surface side of the semiconductor wafer.

Effects of the Invention

The effects obtained by typical aspects of the present invention disclosed in the present application will be briefly described below.

That is, in measurement using a strain sensor chip, temporal change of a measurement error can be suppressed.

BRIEF DESCRIPTIONS OF THE DRAWINGS

BEST MODE FOR CARRYING OUT THE INVENTION

In the embodiments described below, the same or similar components are denoted by the same or similar reference symbols, and the description of the same or similar components will not be repeated in principle unless otherwise particularly required. Further, in the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Hereinafter, the embodiments of the present invention will be described in detail based on the drawings.

First Embodiment

<Strain Sensor Chip Mounting Structure>

Figure 1:
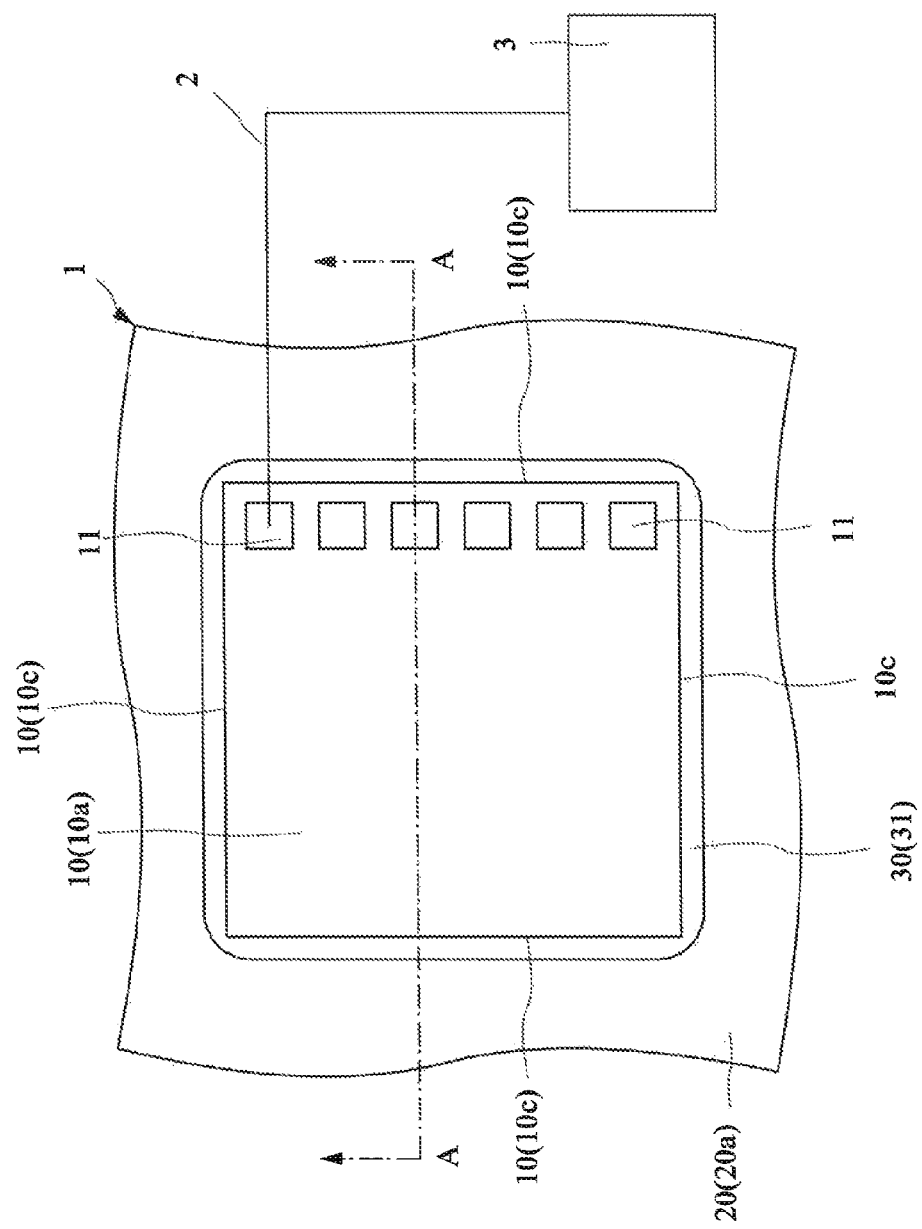
FIG. 1 is a plan view illustrating a strain sensor chip mounting structure according to one embodiment of the present invention.
Figure 2:
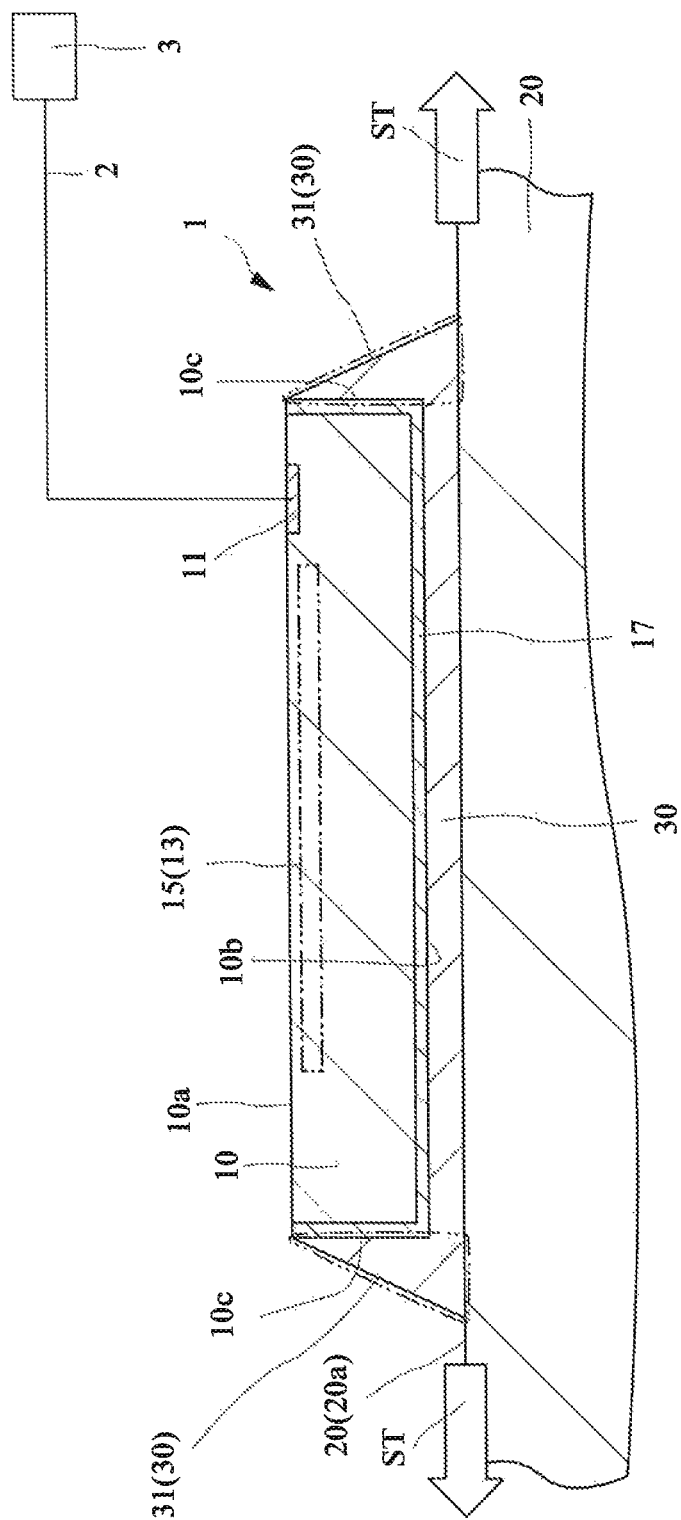
FIG. 2 is an enlarged cross-sectional view taken along a line A-A in FIG. 1.
Figure 3:
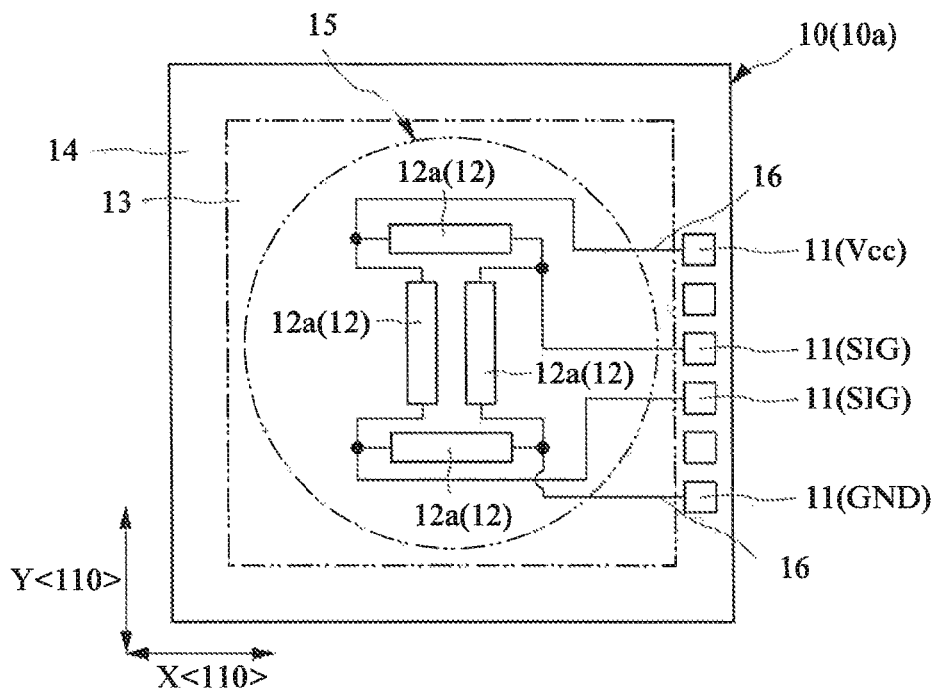
FIG. 3 is a plan view schematically illustrating a configuration of a front surface side of a semiconductor chip illustrated in FIG. 1.
Figure 4:
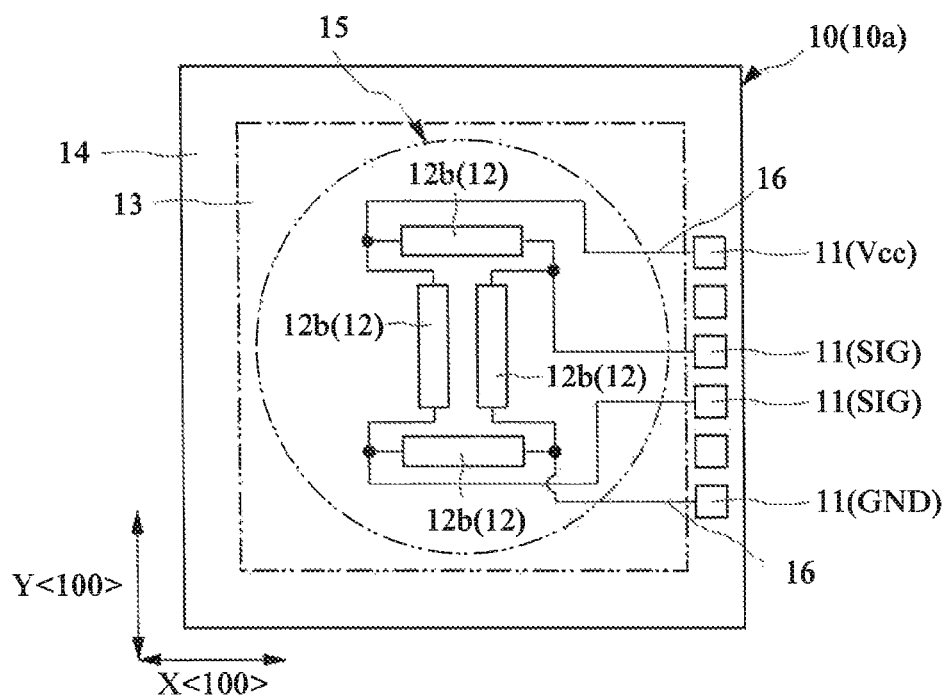
FIG. 4 is a plan view illustrating a semiconductor chip according to a modified example of FIG. 3.

First, a basic configuration of a strain sensor chip mounting structure (dynamic quantity measuring device) according to the present embodiment will be explained. FIG. 1 is a plan view illustrating the strain sensor chip mounting structure according to the present embodiment. Further, FIG. 2 is a cross-sectional view taken along a line A-A in FIG. 1. Moreover, FIG. 3 is a plan view schematically illustrating a configuration of a front surface side of a semiconductor chip illustrated in FIG. 1, and FIG. 4 is a plan view illustrating a semiconductor chip according to a modified example of FIG. 3.

As illustrated in FIG. 1, a sensor module (dynamic quantity measuring device) 1 which is the strain sensor chip mounting structure according to the present embodiment includes: a semiconductor chip (sensor chip, strain sensor chip) 10 which is a semiconductor strain sensor; a strain body (object to be measured) 20 having a surface 20a to be measured; and a metallic bonding material (solder material) 30 for bonding the semiconductor chip 10 and the strain body 20. Further, as illustrated in FIG. 2, in the sensor module 1, a rear surface 10b which is the mounting surface of the semiconductor chip 10 is adhered and fixed to the strain body 20 via, for example, the metallic bonding material 30 which is a solder material. The sensor module 1 is a strain measuring device which transmits strain generated on the surface 20a to be measured in the strain body 20 to the semiconductor chip 10 via the metallic bonding material 30 and detects and measures the strain transmitted to the semiconductor chip 10.

A strain signal that is detected at the semiconductor chip 10 is taken outside via, for example, a wiring portion 2 that is connected to the semiconductor chip 10. As schematically illustrated in FIGS. 1 and 2, the semiconductor chip 10 is electrically connected to a measuring circuit portion 3 via the wiring portion (lead-out wiring portion, flexible wiring plate) 2. The measuring circuit portion 3 performs a processing (for example, arithmetic processing) to, for example, a strain value data signal outputted from the semiconductor chip 10. Further, as the wiring portion 2, a so-called flexible wiring plate having a wiring of a plurality of metallic patterns (not illustrated) sealed inside a resin film (not illustrated) can be used although not particularly limited to this. Moreover, the wiring portion 2 can be formed by, for example, connecting a terminal of the flexible wiring plate with an electrode 11 of the semiconductor 10 via a bonding wire (not illustrated).

As illustrated in FIG. 2, the semiconductor chip 10 includes: a front surface (main surface, circuit element forming surface) 10a; a rear surface (main surface, mounting surface) 10b that is positioned on an opposite side of the front surface 10a; and a side surface 10c that continues to the front surface 10a on a peripheral edge portion of the front surface 10a. Each of the front surface 10a and the rear surface 10b is formed in a rectangle (quadrangle). Further, as illustrated in FIG. 3, the semiconductor chip 10 is formed with a plurality of resistive elements 12 formed in a sensor region 13 positioned at a center portion on the front surface 10a side. Still further, the semiconductor chip 10 is further formed with a plurality of electrodes (pads, electrode pads) 11 that are formed in an input/output circuit region 14 positioned closer to a peripheral edge portion side than a sensor region (core region) 13 on the front surface 10a side and that are electrically connected to the plurality of resistive elements (piezoresistive elements) 12. Each of the plurality of resistive elements 12 is configured of, for example, an impurity diffusing region obtained by doping an impurity to an element forming surface of a silicon substrate including a (100) plane. The semiconductor chip 10 is formed with a detecting circuit (strain detecting circuit, sensor element) 15 obtained by, for example, forming a Wheatstone bridge circuit by electrically connecting four resistive elements 12 for detecting the strain by measurement of change in resistances of the resistive elements 12 through piezoresistive effects. Also, the detecting circuit 15 is connected to the plurality of electrodes 11 via a plurality of wirings 16. Each of the plurality of electrodes 11 is an input/output terminal of the semiconductor chip 10, and includes, for example, a terminal Vcc for supplying a power source potential (first power source potential) to the semiconductor chip 10, a terminal GND for supplying a reference potential (second power source potential) and a terminal SIG for outputting a detected signal.

Further, a layout of the plurality of resistive elements 12 configuring the detecting circuit 15 has the following configuration in the present embodiment although not limited to an aspect illustrated in FIG. 3. That is, when the semiconductor substrate included in the semiconductor chip 10 (for example, a silicon substrate made of silicon (Si)) is made of single crystal (silicon single crystal), each direction (longitudinal direction) in which the plurality of resistive elements 12 configuring the detecting circuit (sensor element, sensor region) 15 extend coincides with a direction <110> or a direction <100> of the semiconductor substrate including the (100) plane. For example, the semiconductor substrate (silicon substrate) included in the semiconductor chip 10 is formed with four p-type diffusing regions (regions to which an impurity with a p-type conductive type is doped) so that current is flowed along a crystal orientation in the <110> direction of the silicon single crystal (which is an X direction and a Y direction which is orthogonal to the X direction in FIG. 3). More particularly, the Wheatstone bridge circuit is formed by two resistive elements 12 which extend in the X direction and two resistive elements 12 which extend in the Y direction orthogonal to the X direction. In other words, in the semiconductor chip 10, the four resistive elements 12a are formed by doping the p-type impurity to four spots so as to extend along the crystal orientation in the <110> direction of the silicon single crystal of the silicon substrate. In the example of FIG. 4 illustrated as a modified example, the semiconductor substrate (silicon substrate) included in the semiconductor chip 10 is formed with four p-type diffusing regions (regions to which an impurity with a p-type conductive type is doped) so that current is flowed along the crystal orientation in the <100> direction of the silicon single crystal. In other words, in the semiconductor chip 10, the four resistive elements 12b are formed by doping an n-type impurity to four spots so as to extend along the crystal orientation in the <100> direction of the silicon single crystal of the silicon substrate.

As illustrated in FIGS. 3 and 4, in the semiconductor chip 10 in which each extending direction of the plurality of resistive elements 12 configuring the detecting circuit 15 coincides with the <110> direction or the <100> direction of the semiconductor substrate including the (100) plane, a difference between, for example, the strain in the X direction and the strain in the Y direction as illustrated in FIGS. 3 and 4 can be outputted as the potential difference. More specifically, a difference between the strain in the X direction and the strain in the Y direction can be outputted from the terminal SIG illustrated in FIGS. 3 and 4 as the potential difference. In this manner, a measuring method of outputting the difference between the strain in the X direction and the strain in the Y direction is advantageous in view of reducing influence of thermal strain applied on the semiconductor chip 10. However, even when the resistive elements 12 are arranged in directions other than those of FIGS. 3 and 4, the strains can be detected while a method of calculating the influence of the thermal strain is complicated.

Further, as illustrated in FIG. 2, the semiconductor chip 10 is fixed to the strain body 20 via the metallic bonding material 30 so that the rear surface 10b and the surface 20a to be measured of the strain body 20 face each other. The strain body 20 is an object of the strain measurement, that is, the object to be measured, and is made of a metallic material such as iron (Fe), copper (Cu), aluminum (Al), so-called stainless steel (iron alloy containing chrome element), or so-called duralumin (aluminum alloy) in the present embodiment although this component material is not particularly limited.

Further, as illustrated in FIG. 2, the metallic bonding material 30 for adhering and fixing the semiconductor chip 10 and the strain body 20 is arranged between the semiconductor chip 10 and the strain body 20. The metallic bonding material 30 is arranged so as to cover the entire rear surface 10b and side surface 10c of the semiconductor chip 10. In other words, a peripheral edge portion of the metallic bonding material 30 expands to outside of the side surface 10c of the semiconductor chip 10 to form a fillet 31. In order to simply adhere and fix the semiconductor chip 10 and the strain body 20 to each other, for example, a resin-made adhesive material such as a thermosetting resin can be used as the bonding material. However, creep deformation is easier to occur in the resin-made adhesive material than a metallic bonding material. Therefore, in view of transmitting the strain caused in the strain body 20 to the semiconductor chip 10 and improving the measuring accuracy, the semiconductor chip 10 and the strain body 20 are bonded to each other via the metallic bonding material 30 made of, for example, solder material in the present embodiment. That is, according to the present embodiment, by bonding the semiconductor chip 10 and the strain body 20 to each other via the metallic bonding material 30 such as a solder material, the creep deformation of the metallic bonding material 30 can be suppressed, and the measuring accuracy of the semiconductor chip 10 which is a semiconductor strain sensor can be improved.

Figure 19:
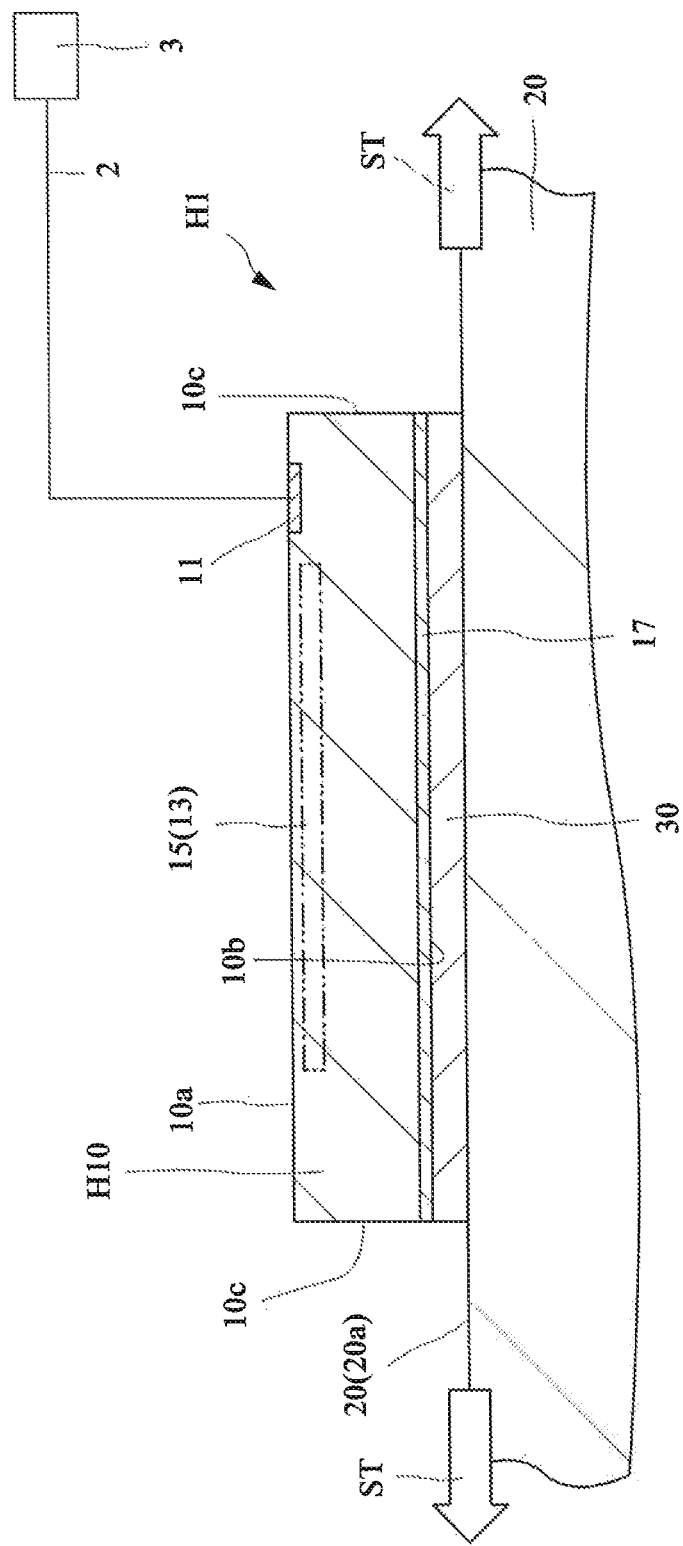
FIG. 19 is a cross-sectional view illustrating a strain sensor chip mounting structure according to a compared example of FIG. 2.

However, from the further studies made by the inventors of the present application, it has been found that the measuring accuracy is reduced in a configuration illustrated in FIG. 19 as a comparative example even when the metallic bonding material 30 is used as the bonding material of the strain body 20 and a semiconductor chip H10. FIG. 19 is a cross-sectional view illustrating a strain sensor chip mounting structure which is a comparative example of FIG. 2. A sensor module H1 illustrated in FIG. 19 is different from the sensor module 1 illustrated in FIG. 2 in that only a rear surface 10b of the semiconductor chip H10 is covered with a metallic film 17 while the semiconductor substrate is exposed on a side surface 10c thereof. When the semiconductor chip H10 is mounted so that the metallic film 17 is formed so as to cover the rear surface 10b as similar to the sensor module H1 while no metallic film 17 is formed on the side surface 10c, the metallic bonding material 30 is not wetly spread to the side surface 10c of the semiconductor chip H10. Therefore, no fillet 31 as illustrated in FIGS. 1 and 2 is formed on the peripheral edge portion of the bonding material 30 of the sensor module H1. And, it has been found that, when a large tensile force is acted on a strain body 20 of the sensor module H1 and it is left as it stands, the strain detected by the semiconductor chip H10 is gradually reduced, and the strain is measured as if it is apparently reduced. That is, it has been found that the measuring accuracy of the sensor module H1 is reduced due to the temporal change of the measurement error. Also, this phenomenon (the change of the measurement error) is remarkably observed particularly when an ambient temperature (environmental temperature) of the sensor module H1 is high. According to the study results of the inventors of the present application, the following two reductions can be considered for main causes of the change of the measurement error of the sensor module H1.

As a first cause, it is considered that a distance between the semiconductor chip H10 and a stress concentration field generated by bonding materials of different types to each other is small. When the materials of different types are bonded to each other, a stress caused by bonding the materials of different types is generated at a bonding interface. This stress value becomes larger as a distance from a center portion of a bonding region is larger when seen in a plan view. That is, the stress concentration field is generated in a peripheral edge portion of the bonding region. Therefore, when, for example, tensile strain ST (strain to be measured) acts on the strain body 20 illustrated in FIG. 19, a strong stress is concentrated on a corner portion at which the rear surface 10b and the side surface 10c of the semiconductor chip H10 intersect each other (on a peripheral edge portion of the rear surface 10b), and this stress largely affects the strain value detected by the semiconductor chip H10. Here, in the case of usage of the metallic bonding material 30, although the creep deformation is significantly suppressed more than the case of usage of the resin adhesive material, the creep deformation is difficult to be completely prevented. Particularly, the creep deformation is easier to occur as the temperature is higher, and is particularly easy to occur in the usage under a high temperature environment of, for example, 100° C. or higher. Therefore, immediately after the action of the tensile strain ST (the strain to be measured), the strong stress generated at the peripheral edge portion of the rear surface 10b is gradually eased by the creep deformation of the metallic bonding material 30. As a result, the strain value detected by the semiconductor chip H10 is gradually reduced as time passes, and the measurement error of the sensor module H1 changes.

Also, as a second cause, influence of bending stress caused on the peripheral edge portion of the semiconductor chip H10 is considered when the strain acts on the strain body 20. When, for example, the tensile strain ST (the strain to be measured) acts on the strain body 20 illustrated in FIG. 19, such warpage deformation (concave warpage deformation) that a center portion of the front surface 10a is lower than the peripheral edge portion thereof is caused in the semiconductor chip H10, so that a bending stress of compression (bending compressive stress) is caused therein. Also, as a counterforce of this bending stress, a strong tensile force stress is caused at the metallic bonding material 30 in the peripheral edge portion of the rear surface 10b of the semiconductor chip H10. Further, the semiconductor chip H10 tries to warp uniformly, and therefore, the bending compressive stress affects not only the peripheral edge portion of the semiconductor chip H10 (the peripheral edge portion of the front surface 10a and the peripheral edge portion of the rear surface 10b) but also the center portion. Here, even when the metallic bonding material 30 is used as described above, it is difficult to completely prevent the creep deformation. Therefore, the bending compressive stress that is caused immediately after the action of the tensile strain ST (the strains to be measured) is gradually eased by the creep deformation of the metallic bonding material 30. As a result, the strain value detected by the semiconductor chip H10 is gradually reduced as time passes, and the measurement error of the sensor module H1 changes.

Even when a general semiconductor chip is mounted and when the creep deformation is generated in the bonding material, a device property due to the creep deformation is not degraded. Further, the stress applied to the semiconductor chip can be reduced by easing the stress generated by bonding the materials of different materials because of the creep deformation, and therefore, this manner is preferable in view of improving the mounting reliability of the semiconductor chip. However, when this manner is applied to the semiconductor chip 10 which is a strain sensor chip as described in the present embodiment, the device property is degraded by the creep deformation. That is, the above-described problem that has been found by the inventors of the present application is a unique problem that is generated in the application to the strain sensor chip mounting structure.

The inventors of the present application have studied further in consideration of the above-described study results, and found the structure of the present embodiment. That is, in the sensor module 1 according to the present embodiment, as illustrated in FIG. 2, the entire rear surface 10b and the side surface 10c of the semiconductor chip 10 are covered with a successively-formed metallic film 17. The metallic film 17 is a metallized layer (metallic layer) for improving a bonding property between the metallic bonding material 30 and the semiconductor chip 10, and is formed by, for example, a vapor deposition method or a plating method. By covering at least partially the rear surface 10b and the side surface 10c by using the successively-formed metallic film 17 as described in the present embodiment, the metallic bonding material can be partially bonded to the side surface 10c of the semiconductor chip 10 as illustrated in FIG. 2. In other words, by forming the metallic film 17 on the side surface 10c of the semiconductor chip 10, the fillet 31 that surrounds the rear surface 10b and the side surface 10c of the semiconductor chip 10 can be formed at the peripheral edge portion of the metallic bonding material 30. In this manner, by forming fillet 31 by partially bonding the metallic bonding material 30 to the side surface 10c of the semiconductor chip 10, the stress generated on the corner portion at which the rear surface 10b and the side surface 10c of the semiconductor chip 10 intersect (on the peripheral edge portion of the rear surface 10b) can be dispersed to the fillet 31. For example, when the tensile strain ST (the strain to be measured) acts on, for example, the strain body 20 illustrated in FIG. 2, the stress due to the bonding of the materials of different types is generated. However, the stress is dispersed by the fillet 31, and therefore, the stress concentration field is not generated in vicinity of the peripheral edge portion of the rear surface 10b of the semiconductor chip 10 even immediately after the action of the tensile strain ST. On the other hand, the stress concentration field is generated at a peripheral edge portion of a bonding interface between the strain body 20 and the metallic bonding material 30. In other words, by forming the fillet 31, the stress concentration field is moved from the vicinity of the rear surface 10b of the semiconductor chip 10 to the vicinity of the peripheral edge portion of the bonding interface with the strain body 20. Here, while the stress is gradually eased since the creep deformation is generated at the bonding interface between the metallic bonding material 30 and the strain body 20, influence on the value detected by the semiconductor chip 10 is small since a distance from the semiconductor chip 10 is large. That is, by forming the fillet 31 by partially bonding the metallic bonding material 30 to the side surface 10c of the semiconductor chip 10, the distance between the semiconductor chip 10 and the stress concentration field generated due to the bonding of the materials of different types can be large. In this manner, a change amount of the measurement error due to the creep deformation of the metallic bonding material 30 can be suppressed to be small.

Figure 5:
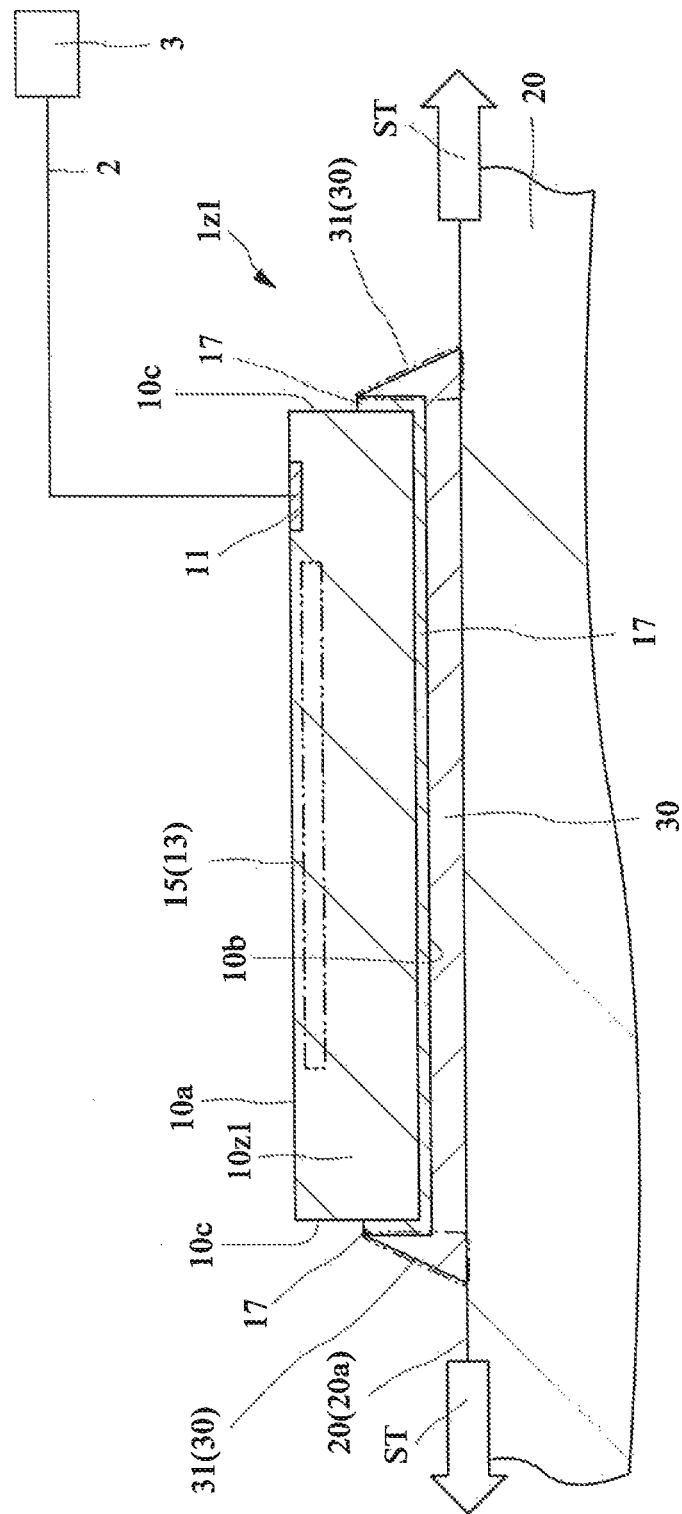
FIG. 5 is a cross-sectional view illustrating a strain sensor chip mounting structure according to the modified example of FIG. 2.

FIG. 2 illustrates an example in which the entire side surface 10c of the semiconductor chip 10 is covered with the metallic film 17, and in which the metallic bonding material 30 is bonded to the entire side surface 10c. However, as seen in a semiconductor chip 10z1 according to a modified example illustrated in FIG. 5, a configuration can be formed so that the side surface 10c on the rear surface 10b side is partially covered with the metallic film 17 while the semiconductor substrate is exposed at the other part on the front surface 10a side. FIG. 5 is a cross-sectional view illustrating the strain sensor chip mounting structure according to the modified example of FIG. 2. The semiconductor chip 10z1 illustrated in FIG. 5 is different from the semiconductor chip 10 illustrated in FIG. 2 in that the side surface 10c on the rear surface 10b side is partially covered with the metallic film 17 while the semiconductor substrate is exposed at the other part on the front surface 10a side. In other points, this is the same as the semiconductor chip 10. Even in a configuration of a sensor module 1z1 illustrated in FIG. 5, a metallic bonding material 30 (fillet 31) is partially bonded so as to partially cover the side surface 10c of the semiconductor chip 10z1, and therefore, the change amount of the measurement error due to the creep deformation of the metallic bonding material 30 can be suppressed to be smaller than that of the comparative example illustrated in FIG. 19. Also, by employing the configuration of the sensor module 1z1, the distance between the metallic film 17 and the electrodes 11 and the distance between the metallic bonding material 30 and the electrodes 11 can be larger than that of the configuration illustrated in FIG. 2. Therefore, such a concern as conduction of the metallic film 17 or the metallic bonding material 30 with the electrode 11 can be reduced.

However, in the case of the sensor module 1z1, a size of the fillet 31 of the metallic bonding material 30 is smaller than that in the case illustrated in FIG. 2, and therefore, the effect of suppression of the change in the measurement error is smaller than that in the case illustrated in FIG. 2. In other words, the larger is preferably better for the bonding area between the side surface 10c and the metallic bonding material 30 in view of the suppression of the change in the measurement error generated by the fact that the distance between the semiconductor chip 10 and the stress concentration field generated by the bonding of the materials of different types is small, so that the metallic bonding material 30 is particularly preferably bonded to the entire side surface 10c as similar to the sensor module 1 illustrated in FIG. 2.

Further, as explained as the second reason for the change in the measurement error, the metallic bonding material 30 is preferably bonded to more than half of regions of the side surface 10c on the rear surface 10b side in view of reducing the influence of the bending stress generated on the semiconductor chip 10 when the strain acts on the strain body 20. In other words, it is preferable that the metallic bonding material 30 that is bonded so as to cover the side surface 10c of the semiconductor chip 10 is formed so as to cover the side surface 10c at an intermediate position between the front surface 10a and the rear surface 10b or at a portion closer to the front surface 10a side than the intermediate position. In still other words, a top portion of the fillet 31 is preferably bonded to the side surface 10c at a portion closer to the front surface 10a side than the intermediate position between the front surface 10a and the rear surface 10b. In this manner, even immediately after the action of the tensile strain ST (the strain to be measured), the bending compressive stress generated on the semiconductor chip 10 can be reduced. As a result, even when the stress is eased by the creep deformation of the metallic bonding material 30, the amount of the change in the measurement error can be suppressed.

Note that the metallic bonding material 30 is subjected to a heat treatment (heating treatment, reflow treatment), so that the metallic bonding material 30 is melted and bonded to an object to be bonded (metallic film 17 or strain body 20), and then, is subjected to a cooling treatment, so that the bonding portion is cured, while details will be explained later. Therefore, depending on the material of the metallic film 17 or the time of heat treatment, the metallic film 17 may be melted and integrated with the metallic bonding material 30 in some cases. In this case, for example, as similar to a sensor module 1z2 illustrated in FIG. 6 as a modified example, the metallic bonding material 30 is apparently bonded directly to the semiconductor substrate configuring a rear surface 10b and a side surface 10c of a semiconductor chip 10z2.

Figure 7:
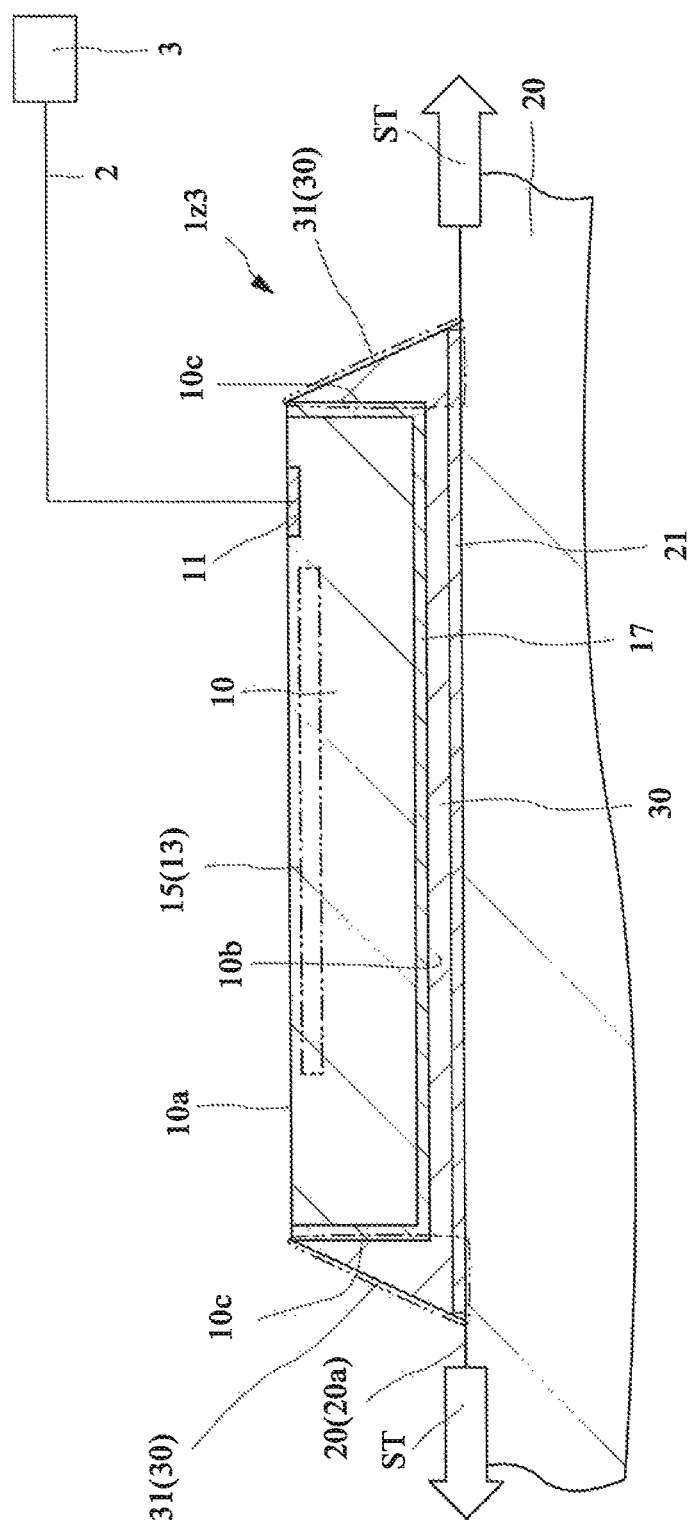
FIG. 7 is a cross-sectional view illustrating a strain sensor chip mounting structure according to still another modified example of FIG. 2.

Also, as similar to a sensor module 1z3 illustrated in FIG. 7 as another modified example, the bonding property with the metallic bonding material 30 can be improved by previously forming a metallic film 21 on the surface 20a to be measured of the strain body 20. In this case, a position of the peripheral edge portion of the metallic bonding material 30 can be controlled by a formation position of the metallic film 21, and therefore, the size and shape of the fillet 31 can be controlled. For example, by forming an area of a formation region of the metallic film 21 so as to be larger than the rear surface 10b of the semiconductor chip 10, and by performing the mounting so that a center portion of the metallic film 21 and a center portion of the rear surface 10b of the semiconductor chip 10 coincide with each other, the peripheral edge portion of the bonding interface between the fillet 31 and the strain body 20 can be stably separated from the semiconductor chip 10.

Figure 8:
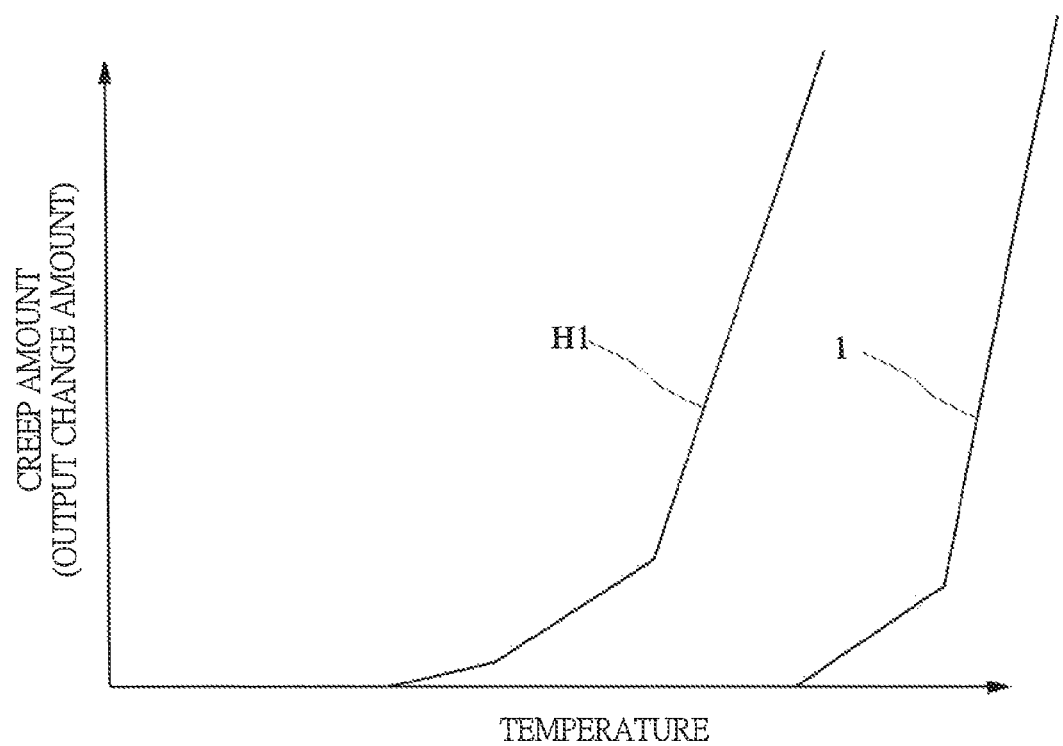
FIG. 8 is an explanatory diagram illustrating a relation between an output change amount and a temperature for the strain sensor chip mounting structure illustrated in FIG. 1 and a strain sensor chip mounting structure illustrated in FIG. 19.

Next, results of evaluation of an output change amount from the semiconductor chips 10 and H10 obtained by forming the sensor module 1 illustrated in FIG. 2 and the sensor module H1 illustrated in FIG. 19 will be explained. FIG. 8 is an explanatory diagram illustrating a relation between the output change amount and a temperature for the strain sensor chip mounting structure illustrated in FIG. 1 and the strain sensor chip mounting structure illustrated in FIG. 19. In FIG. 8, the output change amount per 30 minutes is illustrated as a creep amount on a vertical axis, and an ambient temperature of the sensor modules 1 and H1 are illustrated on a horizontal axis. As illustrated in FIG. 8, the creep amount (output change amount) is increased by increase in the temperature for both of the sensor modules 1 and H1. Also, when the sensor modules 1 and H1 are compared with each other, it has been found that the increase in the creep amount (output change amount) can be suppressed in the case of the sensor module 1 until the temperature is higher. That is, it has been found that a measurement resolution under the high temperature environment is higher in the sensor module 1 than the sensor module H1.

<Method of Manufacturing Strain Sensor Chip Mounting Structure>

Next, a method of manufacturing the above-described sensor module 1 will be explained.

Figure 9:
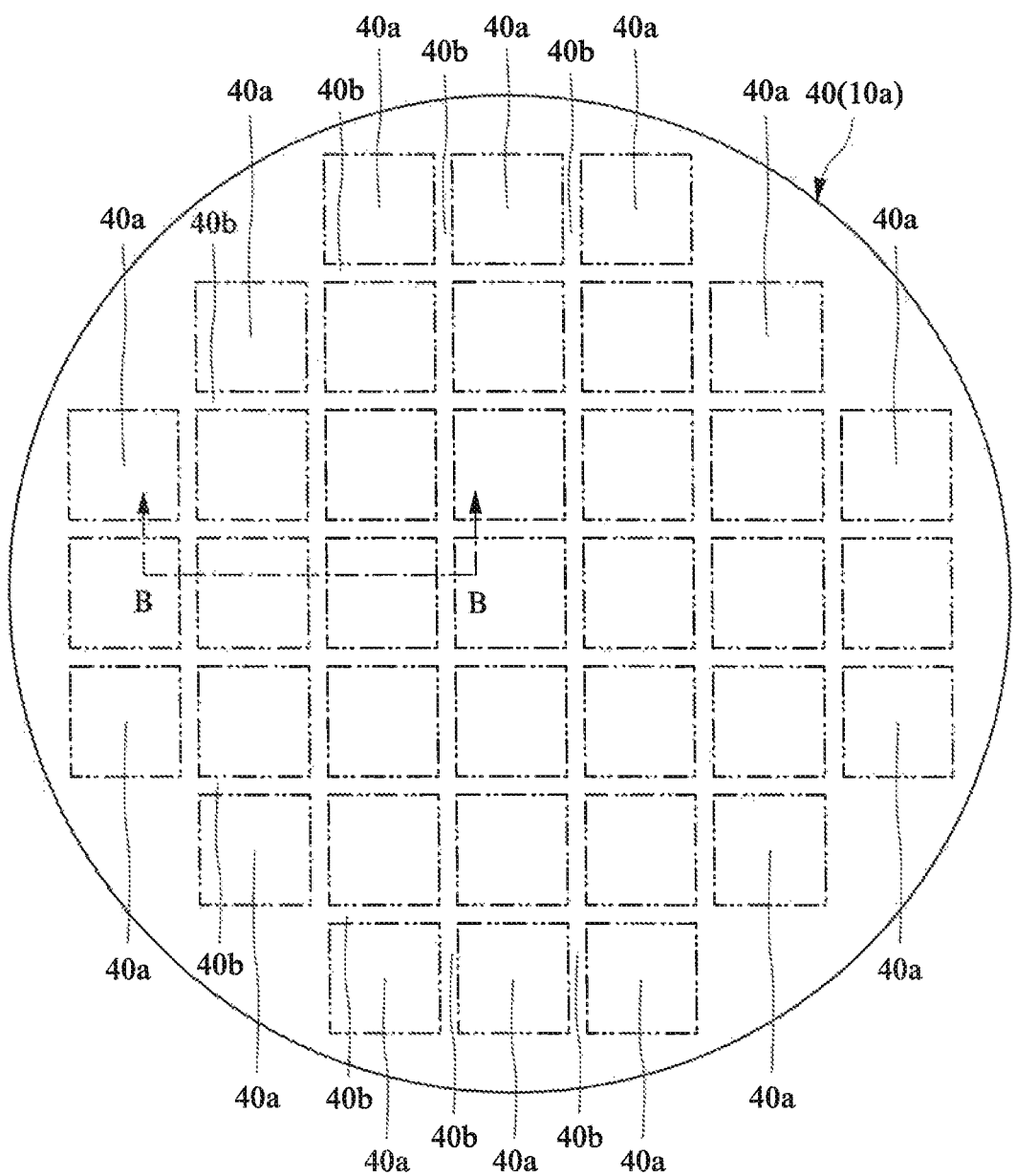
FIG. 9 is a plan view of a semiconductor wafer that is prepared in a method of manufacturing a strain sensor chip mounting structure according to one embodiment of the present invention.

First, as a step of forming the circuit element, a wafer (semiconductor wafer) 40 illustrated in FIG. 9 is prepared, and a strain sensor is formed on a front surface 10a side of the semiconductor wafer 40 (more specifically, an element forming surface of the semiconductor substrate). FIG. 9 is a plan view of the semiconductor wafer that is prepared in the method of manufacturing the strain sensor chip mounting structure according to the present embodiment. The semiconductor wafer 40 that is prepared in the present step has the front surface 10a and the rear surface (not illustrated) that is positioned on the opposite side of the front surface 10a. Also, the front surface 10a has a plurality of chip regions 40a that are arranged in a matrix form and scribe regions 40b that are arranged between the plurality of chip regions 40a. Each of the chip regions 40a corresponds to one semiconductor chip 10 explained with reference to FIGS. 1 to 4. In the present step in the present embodiment, the plurality of resistive elements (piezoresistive elements) 12 explained with reference to FIGS. 3 and 4 are formed on each of the chip regions 40a. Also, the plurality of resistive elements are electrically connected to form a detecting circuit (strain detecting circuit, sensor element) 15. Further, a wiring 16 and a plurality of electrodes 11 that serve as input and output terminals are formed.

Figure 10:
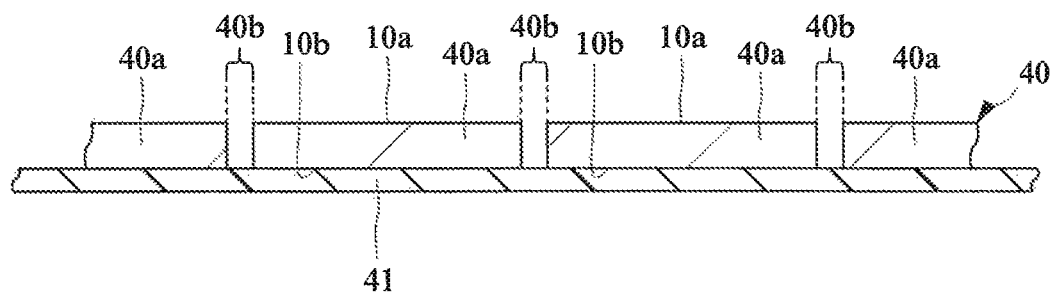
FIG. 10 is an enlarged cross-sectional view illustrating a separation state into pieces for each chip region in a cross-sectional surface taken along a line B-B in FIG. 9.

As a separation step into pieces after the step of forming the circuit element, the semiconductor wafer 40 is cut along the scribe regions 40b to separate the plurality of chip regions 40a into pieces. FIG. 10 is an enlarged cross-sectional view illustrating a separation state into pieces for each chip region in a cross-sectional surface taken along a line B-B in FIG. 9. In the present step, the scribe regions 40b are cut by, for example, performing a cutting process to the scribe regions 40b from the front surface 10a side toward the rear surface 10b in a state in which a supporting member 41 is adhered on the rear surface 10b side of the semiconductor wafer 40 as illustrated in FIG. 10. Although the cutting method is not particularly limited, the scribe regions 40b can be cut by, for example, performing the cutting process by using a rotary blade referred to as a dicing blade. While the supporting member 41 is not particularly limited, for example, an adhesive tape referred to as a dicing tape can be used. Also, as a modified example, the cutting process can be performed from the rear surface 10b toward the front surface 10a. However, an alignment mark or others can be formed on the front surface 10a side, and therefore, the processing from the front surface 10a side is preferable in view of improvement of accuracy of a cutting process position.

Figure 11:
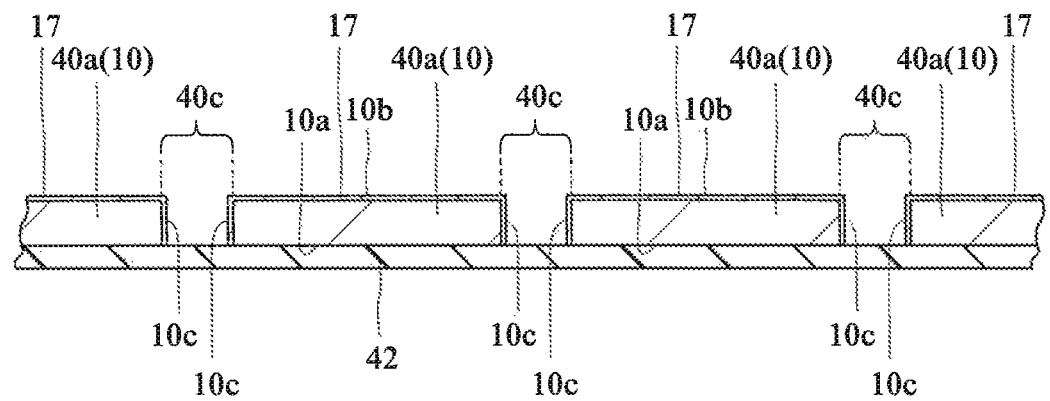
FIG. 11 is an enlarged cross-sectional view illustrating a state of formation of a metal film on each of the separated chip regions illustrated in FIG. 10.
Figure 12:
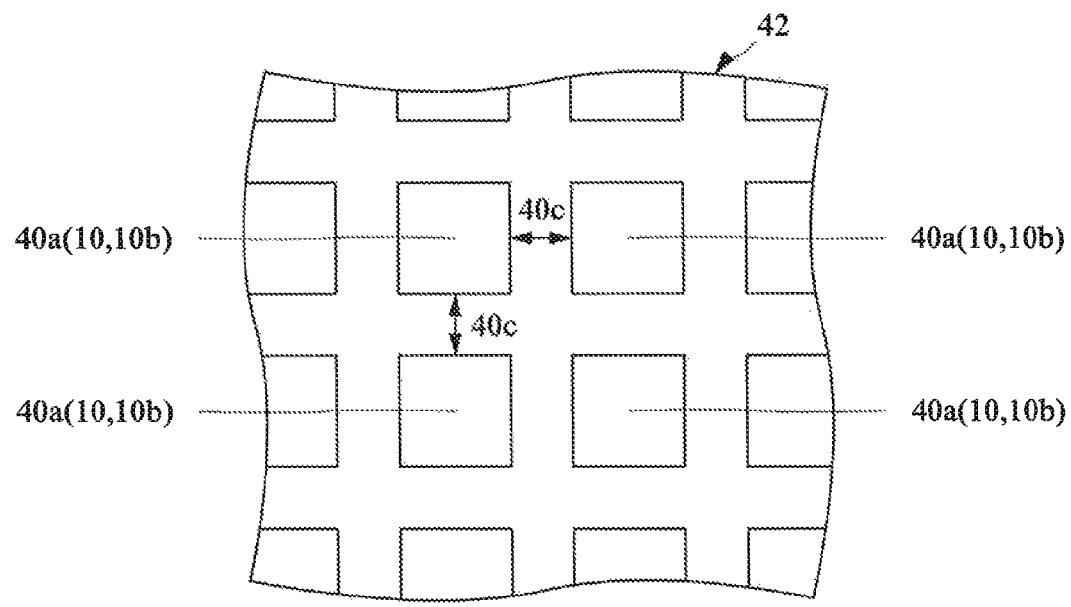
FIG. 12 is an enlarged plan view illustrating a plane layout of the separated chip regions illustrated in FIG. 11.
Figure 13:
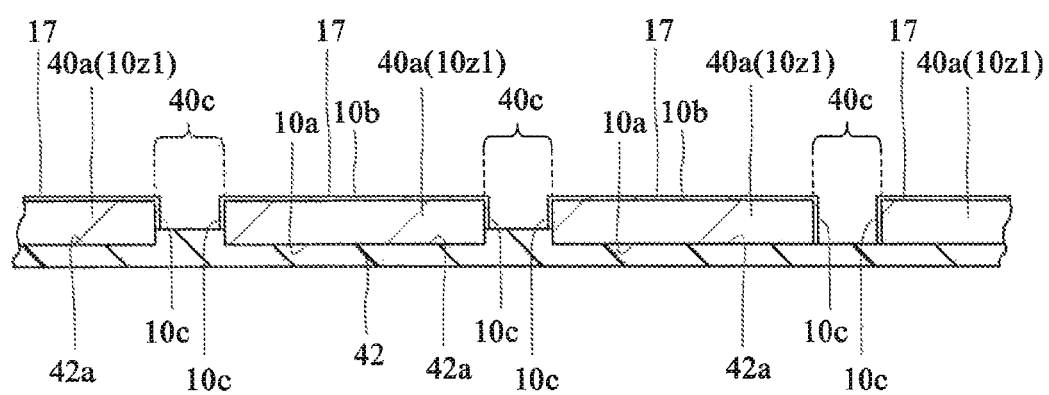
FIG. 13 is an enlarged cross-sectional view illustrating a modified example of FIG. 11.

As a step of forming the metallic film after the separation step into pieces, a metallic film 17 is formed on the rear surface 10b of each of the chip regions 40a and on the side surface 10c continued to the front surface 10a at the peripheral edge portion of the front surface 10a of each of the plurality of the separated chip regions 40a as illustrated in FIG. 11. FIG. 11 is an enlarged cross-sectional view illustrating a formation state of the metal film in each of the chip regions after the separation into pieces illustrated in FIG. 10. Also, FIG. 12 is an enlarged plan view illustrating a plane layout of the separated chip regions illustrated in FIG. 11. Further, FIG. 13 is an enlarged cross-sectional view illustrating a modified example of FIG. 11. In the present step, a mask (jig, protecting jig, adhesive tape) 42 is adhered so as to cover the front surface 10a of each of the chip regions 40a as illustrated in FIG. 11. Still further, the rear surface 10b is exposed by removing the supporting member 41 that has been adhered onto the rear surface 10b in the separation step into pieces. By forming the metallic film 17 in this state, the metallic film 17 can be formed on the rear surface 10b and the side surface 10c which are the exposed surfaces. That is, in the present embodiment, by forming the metallic film 17 after exposing the side surface 10c of each chip region in the separation step into pieces, the metallic film 17 can be formed on the side surface 10c. The method of forming the metallic film 17 is not particularly limited as long as a metallic thin film can be formed, and can be formed by, for example, a vapor deposition method or a plating method.

Also, in view of reliably forming the metallic film 17 on the side surface 10c by the vapor deposition method or the plating method, it is preferable to take a large arrangement distance between the separated chip regions 40a adjacent to each other. For example, by adhering the mask 42 (see FIG. 11) onto the front surface 10a side in a state in which the supporting member 41 illustrated in FIG. 10 is adhered, and then, removing the supporting member 41, the arrangement distance between the plurality of chip regions 40a is defined by each width of the scribe regions 40b. However, by individually picking up the separated chip regions 40a and sequentially adhering the front surface 10a onto an adhesive surface of the mask 42, each of the chip regions 40a can be arranged at an arrangement distance 40c that is wider than the scribe regions 40b (see FIG. 10) as illustrated in FIGS. 11 and 12. In this manner, the metallic film 17 can be reliably formed on the side surface 10c by the vapor deposition method or the plating method. By this fixing, a plurality of semiconductor chips 10 having the metallic film 17 formed on the rear surface 10b and the side surface 10c can be obtained.

Further, by providing a plurality of dent portions 42a in the mask 42 and adhering the front surface 10a of each of the chip regions 40a onto the dent portions 42a so as to be housed therein as described in the modified example illustrated in FIG. 13, a protruding portion between the dent portions 42a adjacent to each other is functioned as a mask for partially covering the side surface 10c. In this manner, the semiconductor chip 10z1 of the modified example explained with reference to FIG. 5 can be obtained.

Next, as a mounting step, the semiconductor chip 10 is mounted on the surface 20a to be measured of the strain body 20 as illustrated in FIG. 2. In the present step, first, the semiconductor chip 10 is arranged so that the surface 20a to be measured of the strain body 20 faces the rear surface 10b of the semiconductor chip 10 via the metallic bonding material 30. FIG. 2 illustrates an example of arrangement of the semiconductor chip 10 on the surface 20a to be measured. However, as long as the surface 20a to be measured and the rear surface 10b are arranged so as to face each other, the arrangement is not limited to the aspect as illustrated in FIG. 2. Further, in view of closely adhering the rear surface 10b of the semiconductor chip 10 and the metallic bonding material 30, it is preferable that the metallic bonding material 30 is softer than the semiconductor chip 10 at the time of arranging the semiconductor chip 10. For example, a bonding material called a solder paste obtained by mixing a solder component (metallic component) and a binder resin satisfies this condition because of exhibiting a paste-like property before a heating treatment.

Next, the metallic bonding material 30 is bonded to the metallic film 17 by, for example, heating the paste-like metallic bonding material 30. In other words, by performing the heat treatment (heating treatment, reflow treatment) to the metallic bonding material 30, the solder component (metallic component) is melted so as to be bonded with the metallic film 17. At this time, the metallic film 17 is successively formed from the rear surface 10b to the side surface 10c, and therefore, the metallic bonding material 30 wets and expands to the side surface 10c so as to cover the metallic film 17 when the metallic bonding material 30 before the heating treatment is closely adhered to the rear surface 10b. That is, by covering the semiconductor chip 10 with the metallic film 17 that is successively formed from the rear surface 10b to the side surface 10c, the side surface 10c and the metallic bonding material 30 can be reliably bonded to each other, and the fillet 31 can be formed. Next, the metallic bonding material 30 is cured by cooling the same so as to fix the semiconductor chip 10 to the surface 20a to be measured of the strain body 20.

Figure 6:
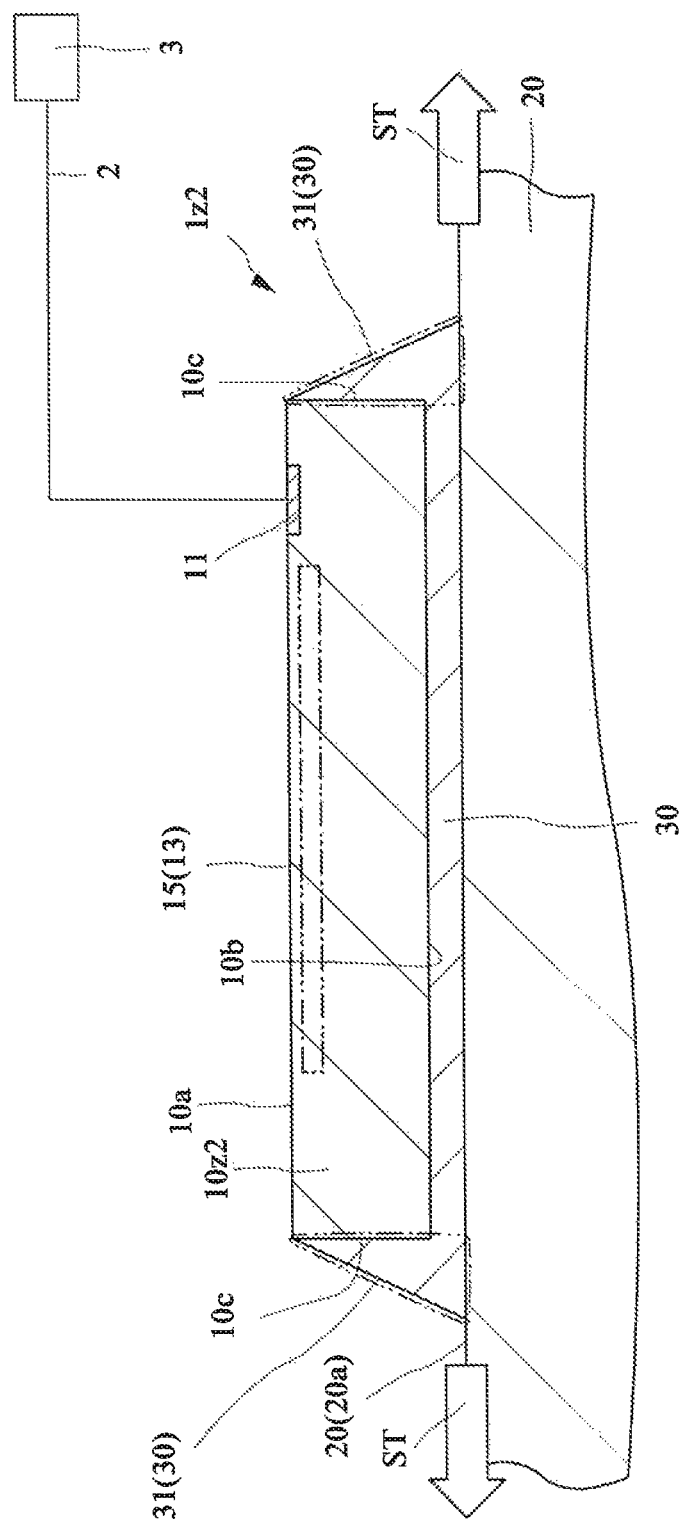
FIG. 6 is a cross-sectional view illustrating a strain sensor chip mounting structure according to another modified example of FIG. 2.

Note that various modified examples such as the sensor module 1z2 illustrated in FIG. 6 and the sensor module 1z3 illustrated in FIG. 7 can be adopted as the modified example of FIG. 2 as already described, and therefore, repetitive explanation will be omitted.

Second Embodiment

Figure 14:
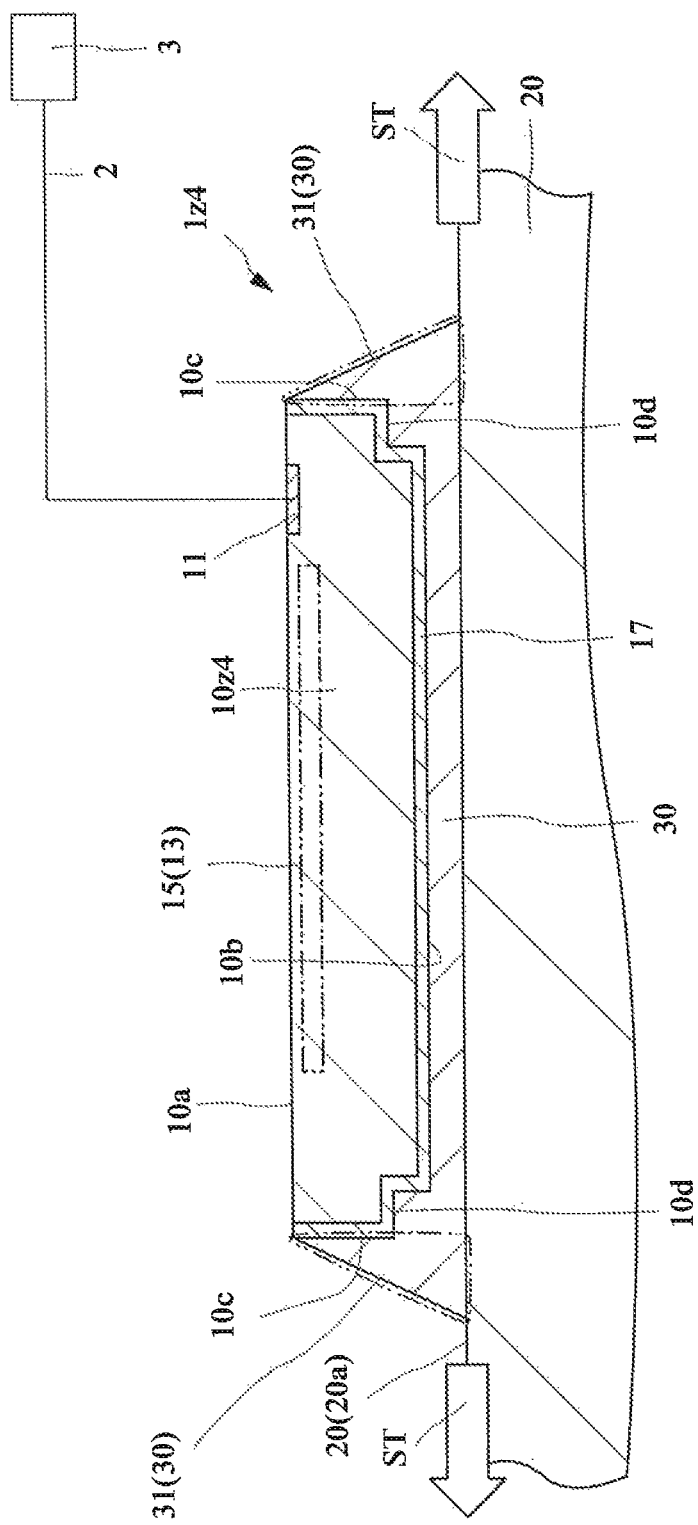
FIG. 14 is a plan view illustrating a strain sensor chip mounting structure according to another embodiment of the present invention.

In the above-described embodiment, the technique for suppressing the temporal change in the measurement error by forming the fillet 31 bonded to the side surface 10c of the semiconductor chip 10 at the peripheral edge portion of the metallic bonding material 30 has been explained. In the present embodiment, a technique capable of suppressing the temporal change in the measurement error in addition to the above-described first embodiment will be explained. FIG. 14 is a cross-sectional view illustrating a strain sensor chip mounting structure according to the present second embodiment. Note that FIG. 14 is a modified example of FIG. 2 explained in the above-described first embodiment, and is the same as the sensor module 1 explained in the above-described first embodiment except for a different point described below, and therefore, repetitive explanations thereof will be omitted.

A sensor module 1z4 illustrated in FIG. 14 is different from the sensor module 1 explained in the above-described first embodiment in that a stepped portion 10d is provided at a peripheral edge portion of a rear surface 10b of a semiconductor chip 10z4. The stepped portion 10d is successively formed so as to surround the peripheral edge portion of the rear surface 10b, and has a dent shape on the front surface 10a side more than the rear surface 10b. In other words, an area of the rear surface 10b of the semiconductor chip 10z4 is smaller than an area of the front surface 10a thereof, and a second rear surface (stepped portion 10d) is arranged so as to successively surround the periphery of the rear surface 10b. The second rear surface (stepped portion 10d) is arranged at a position that is closer to the front surface 10a than the rear surface 10b. In still other words, a thickness from the stepped portion 10d to the front surface 10a is smaller than a thickness from the rear surface 10b to the front surface 10a. Also, the metallic bonding material 30 is successively bonded from the rear surface 10b so as to reach the side surface 10c through the stepped portion 10d, and the stepped portion 10d is covered with the metallic bonding material 30. According to a configuration in which the stepped portion 10d is provided at the peripheral edge portion of the rear surface 10b of the semiconductor chip 10z4 as similar to this sensor module 1z4, the change in the measurement error can be suppressed more than the sensor module 1 explained in the above-described first embodiment.

First, by providing the stepped portion 10d, the stress generated at the metallic bonding material 30 in vicinity of the rear surface 10b of the semiconductor chip 10z4 can be further dispersed. For example, when the tensile strain ST (the strain to be measured) acts on the strain body 20 illustrated in FIG. 14, the stress due to the bonding of the materials of different types is generated. However, the stress is dispersed to a corner portion at which the stepped portion 10d and the rear surface 10b intersect with each other and a corner portion at which the side surface 10c and the stepped portion 10d intersect with each other, and therefore, no stress concentration field is generated in vicinity of the peripheral edge portion of the rear surface 10b of the semiconductor chip 10 even immediately after the action of the tensile strain ST. In this manner, the amount of the change in the measurement error due to the creep deformation of the metallic bonding material 30 can be suppressed to be small.

Further, when the stepped portion 10d is provided at the peripheral edge portion of the rear surface 10b, a thickness of the metallic bonding material 30 is larger in a portion between the stepped portion 10d and the surface 20a to be measured of the strain body 20 than a portion between the rear surface 10b and the surface 20a to be measured. Therefore, the warpage deformation of the semiconductor chip 10 explained as the second cause of the change in the measurement error in the above-described first embodiment can be suppressed. That is, when the strain acts on the strain body 20, the influence of the bending stress generated at the semiconductor chip 10 can be reduced. For example, even immediately after the action of the tensile strain ST (the strain to be measured) on the strain body 20 illustrated in FIG. 14, the bending compressive stress generated on the peripheral edge portion of the semiconductor chip 10 can be reduced. As a result, even when the stress is eased by the creep deformation of the metallic bonding material 30, the amount of the change in the measurement error can be suppressed to be small.

Also, the technique of providing the stepped portion 10d at the peripheral edge portion of the rear surface 10b as illustrated in FIG. 14 can be applied in combination with the modified examples explained with reference to FIG. 5, 6 or 7 although repetitive explanations are omitted. In this manner, the temporal change in the measurement error in the sensor modules 1z1, 1z2 and 1z3 explained in the respective modified examples can be further suppressed.

Figure 20:
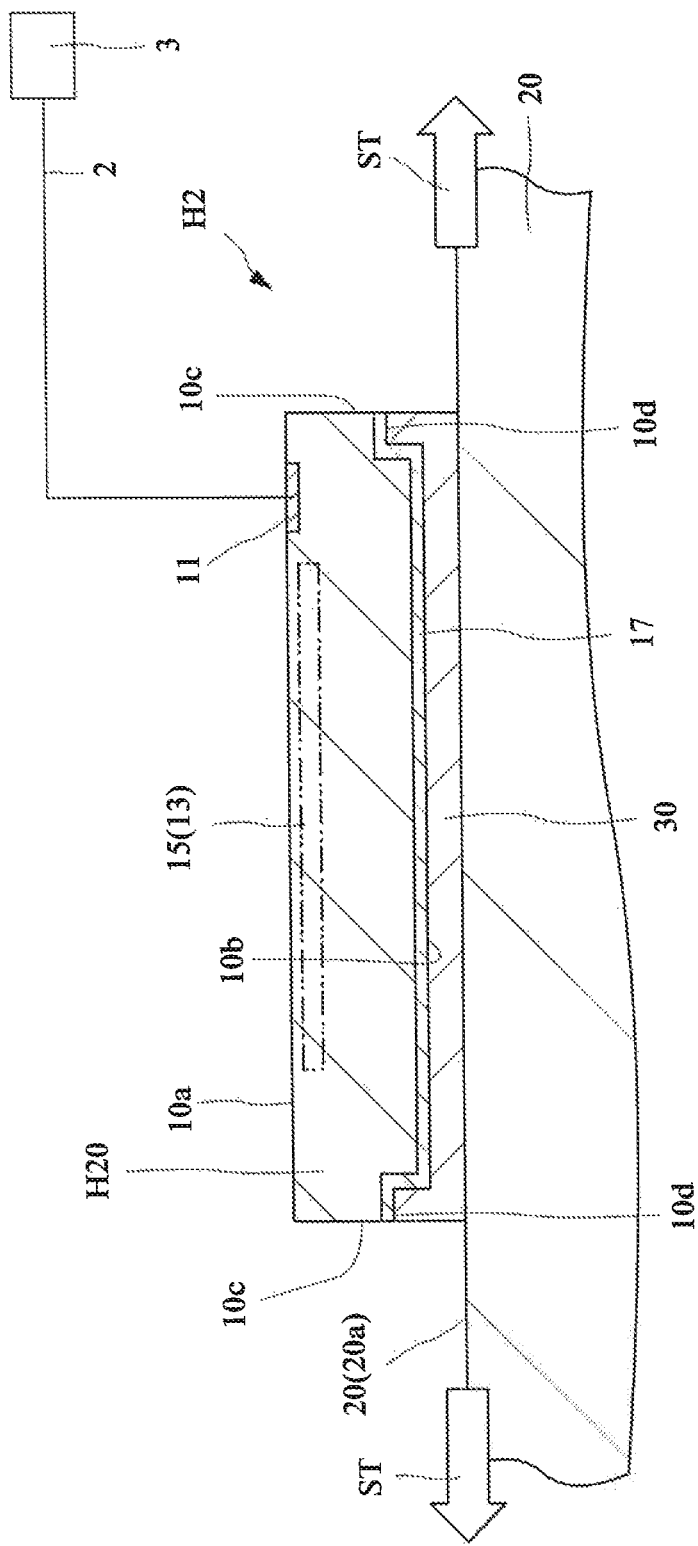
FIG. 20 is a cross-sectional view illustrating a strain sensor chip mounting structure according to another compared example of FIG. 2.

However, even when the stepped portion 10d is provided, no fillet is formed in the case of the sensor module H2 without forming the metallic film 17 on the side surface 10c continued to the front surface 10a as illustrated in FIG. 20. Therefore, immediately after the action of the tensile strain ST (the strain to be measured), large stress concentration is generated in vicinity of the semiconductor chip H20. As a result, by easing the stress by the creep deformation of the metallic bonding material 30, the amount of the change in the measurement error is increased. Further, since the metallic bonding material 30 is not bonded to the side surface 10c, effects of the suppression of the warpage deformation of the semiconductor chip 10 which has been explained as the second cause of the change in the measurement error in the above-described first embodiment are reduced. In this manner, by bonding the metallic bonding material 30 to the side surface 10c continued to the front surface 10a and by providing the stepped portion 10d at the peripheral edge portion of the rear surface 10b, effects of the suppression of the amount of the change in the measurement error are enhanced. However, the effects of the suppression of the amount of the change in the measurement error cannot be sufficiently obtained by merely providing the stepped portion 10d at the peripheral edge portion of the rear surface 10b. That is, in order to reduce the amount of the change in the measurement error, it is preferable to bond the metallic bonding material 30 to the side surface 10c continued to the front surface 10a.

Next, a method of manufacturing the sensor module 1z4 illustrated in FIG. 14 will be explained. The method of manufacturing the sensor module 1z4 is the same as the method of manufacturing the sensor module 1 explained in the above-described first embodiment except for the separation step explained below. Accordingly, a different point from the above-described first embodiment will be explained in the present embodiment, and repetitive explanations will be omitted.

Figure 15:
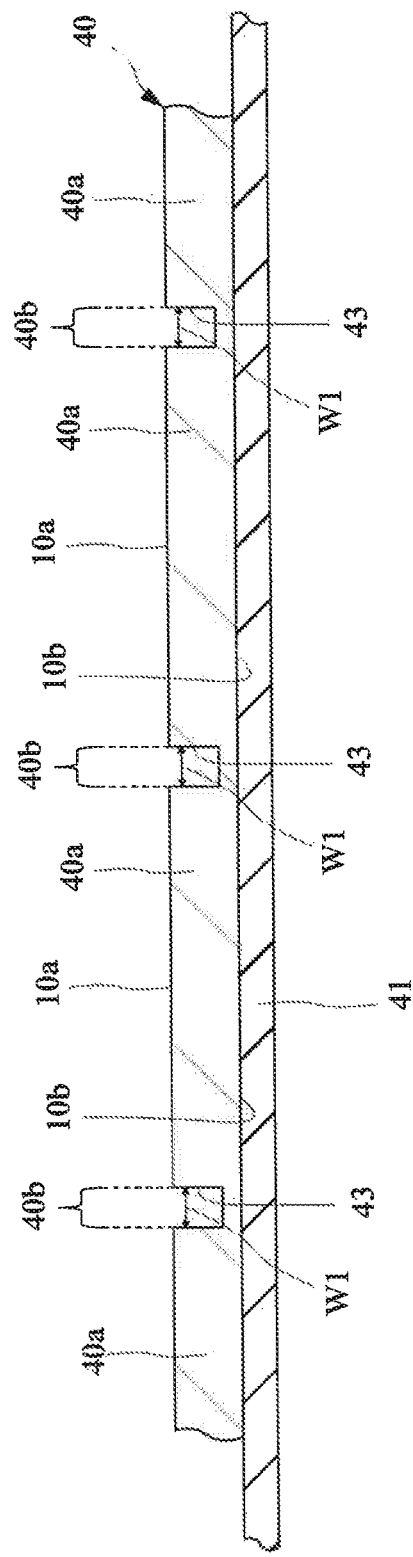
FIG. 15 is an enlarged cross-sectional view illustrating a dicing state from a front surface side in a separation step of a method of manufacturing the strain sensor chip mounting structure illustrated in FIG. 14.
Figure 16:
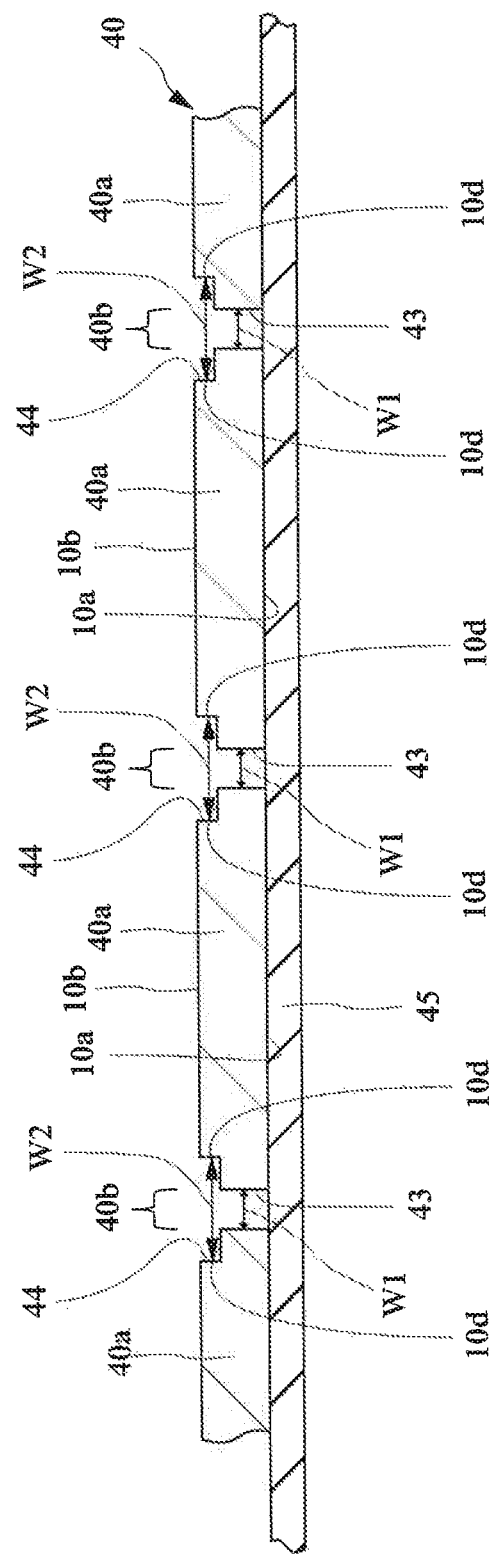
FIG. 16 is an enlarged cross-sectional view illustrating a dicing state from a rear surface side when the semiconductor wafer illustrated in FIG. 15 is turned upside down.

FIG. 15 is an enlarged cross-sectional view illustrating a dicing state from the front surface side in a separation step into pieces in the method of manufacturing the strain sensor chip mounting structure illustrated in FIG. 14. Further, FIG. 16 is an enlarged cross-sectional view illustrating a dicing state from the rear surface side when the semiconductor wafer illustrated in FIG. 15 is turned upside down. The stepped portion 10d illustrated in FIG. 14 can be formed by, for example, the separation step into pieces. That is, the method of manufacturing the strain sensor chip mounting structure of the present embodiment includes a cutting process step from the front surface 10a side of the semiconductor wafer 40 as illustrated in FIG. 15 and a cutting process step from the rear surface 10b side of the semiconductor wafer 40 as illustrated in FIG. 16 after the step of forming the circuit element explained in the above-described first embodiment.

More specifically, in the separation step into pieces in the present embodiment, the cutting process are performed with a first width W1 from the front surface 10a side of the semiconductor wafer 40 to a position between the front surface 10a and the rear surface 10b (middle of the semiconductor wafer 40 in a thickness direction) as illustrated in FIG. 15. In other words, in the present step, a trench 43 having the first width W1 is formed along the scribe regions 40b on the front surface 10a side of the semiconductor wafer 40. At this time, a depth of the trench 43 defines a height (thickness) of the side surface 10c illustrated in FIG. 14, and therefore, it is preferable to form the depth so as to be 50% of a thickness (distance from the front surface 10a to the rear surface 10b) of the semiconductor wafer 40 or larger. In other words, in the present step, it is preferable to form the trench 43 so as to have a depth reaching an intermediate position between the front surface 10a and the rear surface 10b or a position that is closer to the rear surface 10b side than the intermediate position. However, in the present step, it is preferable that a bottom surface of the trench 43 does not reach the rear surface 10b. In other words, it is preferable that the depth of the trench 43 is smaller than the thickness of the semiconductor wafer 40. The cutting process method is not particularly limited. However, as similar to, for example, the above-described first embodiment, the processing can be performed by using, for example, a rotary blade referred to as a dicing blade. The width at the time of the cutting process (cutting width) can be controlled by a width of the dicing blade.

Next, as illustrated in FIG. 16, the semiconductor wafer is turned upside down, and then, is subjected to the cutting process from the rear surface 10b side of the semiconductor wafer 40 so as to take a second width W2 that is larger than the first width W1. In other words, in the present step, a trench 44 having the second width that is larger than the first width W1 is formed along the scribe regions 40b on the rear surface 10b side of the semiconductor wafer 40. At this time, the semiconductor wafer 40 is cut by connecting the trench 43 and trench 44, and the plurality of chip regions 40a are divided into pieces. Also, by forming the trench 44 having the relatively larger width on the rear surface 10b side at the time of the cutting process, the stepped portion 10d can be formed as illustrated in FIG. 16. Further, in view of the suppression of the temporal change in the measurement error as described above, it is preferable to form a large height (thickness) for the side surface 10c (see FIG. 14), and therefore, it is preferable to form the depth of the trench 44 to be smaller (shallower) than the depth of the trench 43.

Moreover, when the cutting process is performed from the rear surface 10b side, it is required to expose the rear surface 10b side. Therefore, as illustrated in FIG. 16, it is preferable to perform the cutting process in states in which a supporting member 45 is adhered on the front surface 10a side of the chip region 40a for supporting the semiconductor wafer 40 and in which the supporting member 41 (see FIG. 15) is removed from the rear surface 10b. For example, as illustrated in FIG. 15, the adhered state illustrated in FIG. 16 can be achieved by adhering the supporting member 45 (see FIG. 16) so as to cover the front surface 10a after forming the trench 43, and then, turning the wafer upside down, then, peeling the supporting member 41 off. Also, the supporting member 45 is not particularly limited. However, for example, an adhesive tape referred to as a dicing tape can be used as similar to the supporting member 41.

Further, the cutting method is not particularly limited. However, the cutting can be performed by using, for example, a dicing blade that is larger in a width than the dicing blade that is used for forming the trench 43. Also, by forming the trench 43 having a relatively smaller width first, and then, forming the trench 44 having a relatively larger width later, the trench 44 can be reliably connected with the trench 43 even when a formation position of the trench 44 is shifted therefrom due to such a reason as the processing accuracy. However, although illustration is omitted, an alignment mark can be formed on the rear surface 10b side in view of improving the positioning alignment accuracy at the time of performing the cutting process from the rear surface 10b side. As a method of forming the alignment mark on the rear surface 10b side, for example, a formation method through by using a double-sided photolithography technique or a method of forming a through hole that reaches from the front surface 10a side to the rear surface 10b side and using the through hole as the alignment mark is cited.

Third Embodiment

In the above-described embodiment, a technique of suppressing the temporal change in the measurement error by forming the fillet 31 bonded to the side surface 10c of the semiconductor chip 10 at the peripheral edge portion of the metallic bonding material 30 has been explained. In the present embodiment, a material composition that is suitably applied to the metallic film 17 or the metallic bonding material 30 explained in the above-described first embodiment will be explained. Note that the explanations will be made for composition examples of the metallic film 17 and the metallic bonding material 30 as explained in the above-described first embodiment. However, the composition materials that will be explained below can be applied in combination with the above-described second embodiment.

As explained in the above-described first embodiment, the creep deformation of the metallic bonding material 30 can be suppressed by bonding the semiconductor chip 10 and the strain body 20 via a metallic bonding material 30 such as a solder material, so that the measuring accuracy of the semiconductor chip 10 which is the semiconductor strain sensor can be improved.

Here, in view of suppressing the creep deformation of the metallic bonding material 30, it is preferable to use a metallic material having a high melting point. Although not limited to the following materials, for example, the following solder materials are cited as the metallic material having the high melting point. First, a case of usage of a eutectic solder material containing tin (Sn) and silver (Ag) as main components (hereinafter referred to as tin-silver (SnAg)-based solder) as the metallic bonding material 30 has a higher melting point than that of a solder material containing, for example, tin (Sn) as a main component (hereinafter referred to as tin solder), and therefore, is preferable in view of suppressing the creep deformation. Note that the solder material is made of only the main component but contains various elements as additional elements in some cases. The above-described main component means the most-contained element among the component elements contained in the solder material. Also, in a case of an eutectic solder materials containing a plurality of elements, the above-described main component means the most- and the second most-contained elements among the component elements contained in the solder material. Hereinafter, when the main components of the solder material are described in the present application, the same definitions as described above are used.

Also, in addition to the tin-silver (SnAg) solder, an eutectic solder material containing gold (Au) and tin (Sn) as the main components (hereinafter referred to as gold-tin (AuSn)-based solder), an eutectic solder material containing gold (Au) and germanium (Ge) as the main components (hereinafter referred to as gold-germanium (AuGe)-based solder) and an eutectic solder material containing gold (Au) and silicon (Si) as the main components (hereinafter referred to as gold-silicon (AuSi)-based solder) also have higher melting points than that of the tin solder. Therefore, the usage of these materials as the metallic bonding material 30 is preferable more than the usage of the tin solder in view of the suppressing the creep deformation.

Figure 17:
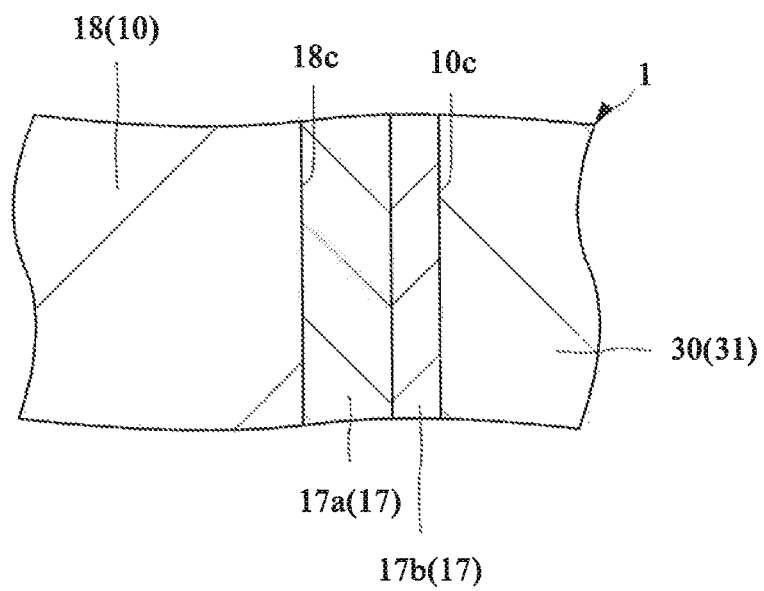
FIG. 17 is an enlarged cross-sectional view illustrating one example of a bonding interface between the side surface of the semiconductor chip illustrated in FIG. 2 and a metallic bonding material.

Further, as illustrated in FIG. 2, in order to bond the metallic bonding material 30 to the side surface 10c of the semiconductor chip 10, it is required to wet and spread the melted metallic bonding material 30 along the side surface 10c in the mounting process that has been explained in the above-described first embodiment. In view of improving this wettability, it is preferable to arrange a material having a lower melting point than that of the metallic bonding material 30 on the bonding interface between the metallic film 17 and the metallic bonding material 30. FIG. 17 is an enlarged cross-sectional view illustrating one example of the bonding interface between the side surface of the semiconductor chip illustrated in FIG. 2 and the metallic bonding material.

In the example illustrated in FIG. 17, the metallic film 17 is a stacked film including a base metallic layer 17a covering a semiconductor substrate 18 and a most-superficial metallic layer 17b covering the base metallic layer 17a. Here, the most-superficial metallic layer 17b that contacts the metallic bonding material 30 is made of a metallic material having a lower melting point than that of the metallic bonding material 30, the most-superficial metallic layer 17b melts faster than the metallic bonding material 30 in the above-described mounting step. In this manner, the melting point of the bonding interface is decreased at the time of the melting which is the time of forming the fillet 31, so that a viscosity of the molten metal is reduced. And, by reducing the viscosity of the molten metal, the melted metallic bonding material 30 actively wets and spreads on the side surface 10c of the semiconductor chip 10 so as to be against gravity. As a result, a thickness of the fillet 31 that is bonded to the side surface 10c of the semiconductor chip 10 (thickness in a direction orthogonal to the side surface 10c) increases. And, by forming the fillet 31 to have a large thickness, the stress applied in vicinity of the peripheral edge portion of the rear surface 10b of the semiconductor chip 10 that has been explained as the first cause of the change in the measurement error in the above-described first embodiment can be dispersed. And the warpage deformation of the semiconductor chip 10 that has been explained as the second cause of the change in the measurement error in the above-described first embodiment can be suppressed.

On the other hand, in view of improving the bonding strength with the semiconductor substrate 18, the base metallic layer 17a that closely adheres to the semiconductor chip 10 is preferably a material that improves the bonding strength with the semiconductor substrate 18, such as a metallic layer containing titanium (Ti) or nickel (Ni) element. In this case, the melting point of the most-superficial metallic layer 17b is lower than the melting point of the base metallic layer 17a. In this manner, by forming the metallic film 17 to be the stacked film, the bonding strength between the metallic film 17 and the semiconductor substrate 18 can be improved, and the wettability between the metallic film 17 and the metallic bonding material 30 can be improved. Note that the metallic film 17 has been explained as the stacked film including two metallic layers. However, the number of the stacked layers is not limited to two. For example, it may be configured so that one or a plurality of intermediate metallic layers (whose illustration is omitted) are arranged between the base metallic layer 17a and the most-superficial metallic layer 17b illustrated in FIG. 17.

Next, a preferable material for the component material of the metallic film 17 will be explained in combination with the above-described specific examples of the metallic bonding material 30. In the case of the usage of the tin-silver (SnAg)-based solder as described above, the melting point can be decreased to be lower than that of the metallic bonding material 30 by bringing a concentration of bismuth (Bi) contained in the most-superficial metallic layer 17b to be higher than a concentration of bismuth (Bi) of portions other than the bonding interface of the metallic bonding material 30. Also, the concentration of bismuth (Bi) contained in the most-superficial metallic layer 17b becomes higher than a concentration of bismuth (Bi) contained in the base metallic layer 17a. Further, as described above, when a gold-tin (AuSn)-based solder, a gold-germanium (AuGe)-based solder or a gold-silicon (AuSi)-based solder is used as the metallic bonding material 30, the melting point can be decreased to be lower than that of the metallic bonding material 30 by bringing a concentration of tin (Sn) contained in the most-superficial metallic layer 17b to be higher than a concentration of tin (Sn) of portions other than the bonding interface of the metallic bonding material 30. Also, the concentration of tin (Sn) contained in the most-superficial metallic layer 17b is higher than a concentration of tin (Sn) contained in the base metallic layer 17a.

Incidentally, the function of improving the wettability of the most-superficial layer is shown by the melting into the metallic bonding material 30, and therefore, the bonding interface cannot be clearly visually checked as the mounting structure (see, for example, the modified example illustrated in FIG. 6). However, the bonding interface can be recognized by performing element analysis because of such a result that a region having a higher concentration of bismuth (Bi) or tin (Sn) than other portions exists between the exposed surface of the metallic bonding material 30 and a side surface 18c of the semiconductor substrate 18.

In the foregoing, the invention made by the present inventors has been concretely described based on the embodiments. However, it is needless to say that the present invention is not limited to the foregoing embodiments and various modifications and alterations can be made within the scope of the present invention.

Figure 18:
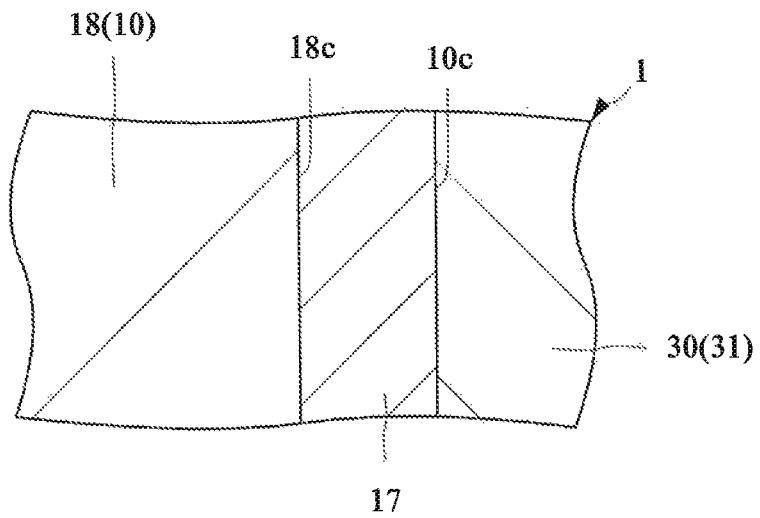
FIG. 18 is an enlarged cross-sectional view illustrating a modified example of FIG. 17.

For example, in the above-described third embodiment, an example of usage of the stacked film as the metallic film 17 has been explained. However, the metallic film 17 can be also a single-layered structure as illustrated in FIG. 18 as a modified example. In this case, the metallic film 17 is made of a metallic material having a lower melting point than that of the component material of the metallic bonding material 30, so that the wettability of the metallic bonding material 30 can be improved. More specifically, bismuth (Bi) or tin (Sn) is contained in the metallic film 17 so as to have a higher concentration than that of the metallic bonding material 30, so that the wettability of the metallic bonding material 30 can be improved.

Further, the aspect for improving the wettability of the metallic bonding material 30 made of the solder material with the metallic film 17 as the stacked film structure has been explained in the above-described third embodiment. However, the aspect can be applied to, for example, a metallic film 21 illustrated in FIG. 7. That is, the metallic film 21 is formed to be a stacked film, and the metallic layer in the most-superficial surface is made of a material having a lower melting point than that of the metallic bonding material 30. In this manner, the wettability between the metallic bonding material 30 and the strain body 20 can be improved, and the bonding strength can be improved.

INDUSTRIAL APPLICABILITY

The present invention can be widely utilized in manufacturing industry which manufactures a dynamic quantity measuring device.

The invention claimed is:

1. A strain sensor chip mounting structure comprising:
an object to be measured including a surface to be measured;
a strain sensor chip including a first main surface, a strain sensor element formed on the first main surface side, a second main surface positioned on an opposite side of the first main surface, and a side surface continued to the first main surface at a peripheral edge portion of the first main surface, the strain sensor chip being fixed to the object to be measured so that the surface to be measured and the second main surface face each other; and
a metallic bonding material which is interposed between the surface to be measured and the second main surface of the strain sensor chip and which is bonded to the surface to be measured and the second main surface of the strain sensor chip,
wherein the entire second main surface and the side surface of the strain sensor chip are covered with a successively-formed metallic film, and
the metallic bonding material is bonded to the metallic film which is formed on the side surface of the strain sensor chip.

2. The strain sensor chip mounting structure according to claim 1,
wherein the metallic bonding material bonded so as to cover the side surface of the strain sensor chip is formed at the side surface so as to cover an intermediate position between the first main surface and the second main surface or a portion that is closer to the first main surface side than the intermediate position.

3. The strain sensor chip mounting structure according to claim 2,
wherein a stepped portion is provided at a peripheral edge portion of the second main surface of the strain sensor chip, and
the stepped portion is covered with the metallic bonding material.

4. The strain sensor chip mounting structure according to claim 3,
wherein an area of the second main surface of the strain sensor chip is smaller than an area of the first main surface, and
the stepped portion is arranged so as to successively surround a periphery of the second main surface.

5. The strain sensor chip mounting structure according to claim 1,
wherein a metallic layer having a lower melting point than a melting point of the metallic bonding material is arranged at a bonding interface between the metallic film and the metallic bonding material.

6. The strain sensor chip mounting structure according to claim 1,
wherein the metallic bonding material is an eutectic solder material containing tin (Sn) and silver (Ag) as main components, and a bonding interface between the metallic film and the metallic bonding material is higher in a concentration of bismuth (Bi) than a portion other than the bonding interface of the metallic bonding material.

7. The strain sensor chip mounting structure according to claim 1,
wherein the metallic bonding material is an eutectic solder material containing gold (Au) and tin (Sn), gold (Au) and germanium (Ge), or gold (Au) and silicon (Si) as main components, and a bonding interface between the metallic film and the metallic bonding material is higher in a concentration of tin (Sn) than a portion other than the bonding interface of the metallic bonding material.

8. A strain sensor chip comprising:
a first main surface;
a strain sensor element formed on the first main surface side;
a second main surface positioned on an opposite side of the first main surface; and
a side surface continued to the first main surface at a peripheral edge portion of the first main surface,
wherein the entire second main surface and the side surface are covered with a successively-formed metallic film,
wherein the metallic film is a stacked film in which a plurality of metallic layers are stacked, and
a most-superficial metallic layer of the stacked film has a lower melting point than a melting point of a base metallic layer.

9. The strain sensor chip according to claim 8,
wherein the metallic film is formed at the side surface so as to cover an intermediate position between the first main surface and the second main surface or a portion that is closer to the first main surface side than the intermediate position.

10. The strain sensor chip according to claim 8,
wherein a stepped portion is provided at a peripheral edge portion of the second main surface, and
the stepped portion is covered with the metallic film.

11. The strain sensor chip according to claim 10,
wherein an area of the second main surface is smaller than an area of the first main surface, and
the stepped portion is arranged so as to successively surround a periphery of the second main surface.

12. The strain sensor chip according to claim 8,
wherein the metallic film contains bismuth (Bi) or tin (Sn).

13. A strain sensor chip comprising:
a first main surface;
a strain sensor element formed on the first main surface side;
a second main surface positioned on an opposite side of the first main surface; and
a side surface continued to the first main surface at a peripheral edge portion of the first main surface,
wherein the entire second main surface and the side surface are covered with a successively-formed metallic film,
wherein the metallic film is a stacked film in which a plurality of metallic layers are stacked, and
a most-superficial metallic layer of the stacked film is higher in a concentration of bismuth (Bi) or tin (Sn) than a base metallic layer.

14. A method of manufacturing a strain sensor chip mounting structure comprising the steps of:
(a) preparing a semiconductor wafer including a plurality of chip regions arranged in a matrix form and a scribe region which is arranged between the plurality of chip regions, and forming a strain sensor element for each of the plurality of chip regions on a first main surface side of the semiconductor wafer;
(b) after the step of (a), cutting the semiconductor wafer along the scribe region, and separating the plurality of chip regions into pieces;
(c) after the step of (b), obtaining a strain sensor chip by forming a metallic film on a second main surface positioned on an opposite side of the first main surface and on a side surface continued to the first main surface at a peripheral edge portion of the first main surface of each of the plurality of separated chip regions; and
(d) bonding a metallic bonding material to the metallic film by arranging the strain sensor chip so that a surface to be measured of an object to be measured and the second main surface of the strain sensor chip face each other via the metallic bonding material, and then, melting the metallic bonding material.

15. The method of manufacturing a strain sensor chip mounting structure according to claim 14,
wherein, in the step of (c), the metallic film is formed at the side surface of the strain sensor chip so as to cover an intermediate position between the first main surface and the second main surface or a portion that is closer to the first main surface side than the intermediate position.

16. The method of manufacturing a strain sensor chip mounting structure according to claim 15,
wherein the step of (b) includes the steps of:
(b1) after the step of (a), forming a first trench having a first width by performing a cutting process from the first main surface side of the semiconductor wafer along the scribe region; and
(b2) after the step of (b1), separating the plurality of chip regions into pieces by cutting the semiconductor wafer so as to form a second trench having a second width larger than the first width from the second main surface side of the semiconductor wafer along the scribe region.

17. The method of manufacturing a strain sensor chip mounting structure according to claim 14,
wherein, in the step of (c), the metallic film containing bismuth (Bi) or tin (Sn) is formed.

18. The method of manufacturing a strain sensor chip mounting structure according to claim 14,
wherein, the step of (c) includes the step of forming the metallic film made of a stacked film obtained by stacking a plurality of metallic layers on a semiconductor substrate, and
a metallic layer made of a material having a lower melting point than a melting point of a base metallic layer is formed on a most-superficial metallic layer of the stacked film.

19. The method of manufacturing a strain sensor chip mounting structure according to claim 14,
wherein the step of (c) includes the step of forming the metallic film made of a stacked film obtained by stacking a plurality of metallic layers on a semiconductor substrate, and
a metallic layer which is higher in a concentration of bismuth (Bi) or tin (Sn) than of a base metallic layer is formed on a most-superficial metallic layer of the stacked film.

* * * * *